United States Patent [19]

Ozaki et al.

[11] Patent Number: 5,559,350
[45] Date of Patent: Sep. 24, 1996

[54] DYNAMIC RAM AND METHOD OF MANUFACTURING THE SAME

[75] Inventors: Thoru Ozaki, Tokyo; Kazumasa Sunouchi, Kanagawa-ken; Seiichi Takedai, Tokyo; Yoshiyuki Shioyama, Kanagawa-ken, all of Japan

[73] Assignee: Kabushiki Kaisha Toshiba, Kanagawa-ken, Japan

[21] Appl. No.: 350,156

[22] Filed: Nov. 29, 1994

Related U.S. Application Data

[63] Continuation of Ser. No. 909,392, Jul. 8, 1992, abandoned.

[51] Int. Cl.$^6$ .................................................. H01L 27/108
[52] U.S. Cl. ........................ 257/304; 257/305; 257/303; 257/506
[58] Field of Search .................................. 257/301, 303, 257/304, 305, 506

[56] References Cited

U.S. PATENT DOCUMENTS 4,860,070  8/1989  Arimoto et al. ........................ 257/301

FOREIGN PATENT DOCUMENTS

| 60-239053 | 5/1984 | Japan . | |
|---|---|---|---|
| 62-247560 | 10/1987 | Japan | 257/304 |
| 63-310163 | 12/1988 | Japan | 257/305 |

*Primary Examiner*—Jerome Jackson, Jr.
*Attorney, Agent, or Firm*—Finnegan, Henderson, Farabow, Garrett & Dunner, L.L.P.

[57] ABSTRACT

A dynamic RAM array comprises a substrate, a plurality of semiconductor island regions and a trench region formed on the substrate, each island region being surrounded by the trench region, and the trench region having wider trench portions and narrower trench portions, an insulating layer formed on the trench region, capacitors refilled in the wider trench portions, each capacitor having a plate electrode, a capacitor insulating layer and a storage node electrode, refilled layers formed in the narrower trench portion, for forming field isolation regions, MOS transistors formed on the island region, each MOS transistor having a source, a drain and a gate as word line, one of the source and drain being coupled with the storage node electrode, and bit lines perpendicular to the word line, being coupled with the other of the source and drain.

17 Claims, 27 Drawing Sheets

DYNAMIC RAM AND METHOD OF MANUFACTURING THE SAME

This application is a continuation of application Ser. No. 07/909,392, filed Jul. 8, 1992 abandoned.

BACKGROUND OF THE INVENTION

1. Field of the Invention

The present invention relates to a semiconductor device, and more particularly, to the cell structure of a dynamic RAM (DRAM), and also to a method of manufacturing the DRAM.

2. Description of the Prior Art

The integrated density of a DRAM, which has memory cells each comprising one MOS transistor and one capacitor, is gradually increasing. The higher the integration density, the smaller the area occupied by the capacitor of each memory cell. The smaller the area of the capacitor, the less charge the capacitor accumulates. Consequently, destruction of the data in the memory cell is more likely to take place.

FIG. 1A is a sectional view of a memory cell array of a conventional DRAM with a trench type capacitor structure.

FIG. 1B shows a plane view of such a memory cell. Line A—A shows the location of the sectional view shown in FIG. 1A.

As shown in FIG. 1A, DRAM cell 1000 is formed on a Si substrate 1001 and it has a MOSFET 1002 and a trench type capacitor 1003 which comprises an SiO$_2$ layer 1004, a storage node electrode 1005, a capacitor insulating layer 1006, and a plate electrode 1007 in this order.

A part of the storage node electrode 1005 is coupled with one of a source/drain regions 1010 of the MOSFET by a storage node contact 1016. A gate electrode 1011 operates as a word line, 1012 is a bit line. A bit line contact 1013 is shared by two adjacent memory cells. Also, a passing word line 1014 passes over the plate electrode of the trench capacitors. Each cell is isolated by field area 1015 formed by LOCOS method. An arrangement of the trenches of the DRAMs is symmetrical to the shared bit line contact.

However, as shown in FIG. 1A, reducing the memory cell size is limited by the field area 1015 and the array of the cells.

As shown in FIG. 1B, this structure has a possibility that leakage currents may occur between a storage node contact 1016 of the memory cell 1000 and the adjacent memory cell 1017, if the distance t between the adjacent memory cells becomes shorter by increasing the integrated density.

Leakage currents tend to flow from a storage node contact 1016 to other storage node contacts or to the source/drain regions.

Accordingly, the distance t among the adjacent storage node contacts of the memory cell could not be minimized adequately.

Also, there is the possibility of leakage currents caused by narrowing the distance between the storage node contact and the device area of the adjacent cell. The narrowing of the distance may be caused by alignment errors when the storage node contact is patterned, because the contact must be formed by removing a very small part of SiO$_2$ layer 1004. To prevent leakage currents, a precise alignment and a strict resolving power are needed.

Moreover, in this structure, the step of plate electrode 1007 over the trench capacitors and the LOCOS field area 1015 becomes a dominant cause which leads to interconnections of word lines or bit lines formed afterward. To prevent the problem, the step may be formed by a thinner plate layer. However, this will cause another problem in that the resistivity of the layer is made higher.

Even if the field area 1015 is made by a BOX isolating method, which is a way to form a trench on the substrate and refill the trench with an insulating layer, the problem of the plate electrode step cannot be solved completely.

SUMMARY OF THE INVENTION

The first object of the present invention is to provide a DRAM with a trench capacitor cell structure having a plurality of memory cells which achieve an increased high integration density.

The second object of the present invention is to provide a method of manufacturing the DRAM described above.

The third object of the present invention is to provide a DRAM which decreases leakage currents between memory cells.

To attain the first object of the invention, there is provided a dynamic RAM array which comprises:

a substrate;

a plurality of semiconductor island regions and a trench region formed on the substrate, each island region being surrounded by the trench region, and the trench region having wider trench portion sand narrower trench portions;

an insulating layer formed on the trench region;

capacitors refilled in the wider trench portions, each capacitor having a plate electrode, a capacitor insulating layer and a storage node electrode;

refilled layers formed in the narrower trench portions, for forming field isolation regions;

MOS transistors formed on the island regions, each MOS transistor having a source, a drain and a gate as a word line, one of the source and drain being coupled with the storage node electrode;

bit lines formed perpendicular to the word line, coupled with the other of the source and drain of the MOS transistors.

To achieve the second object of the invention, there is provided a method of manufacturing a dynamic RAM array, which comprises the steps of:

forming a plurality of semiconductor island regions and a trench region having wider trench portions and narrower trench portions on a substrate, the island regions being surrounded by the trench region;

forming an insulation layer on the trench region;

making capacitors in each wider trench portion, the capacitor being formed of a plate electrode, a capacitor insulating layer and a storage node electrode;

forming refilled layers in the narrower trench portions in order to make field isolation regions;

making MOS transistors on the island regions, the MOS transistors having a source, a drain and a gate as a word line, one of the source and drain being coupled with the storage node electrode;

forming bit lines so as to be coupled with the other of the source and drain of the MOS transistor.

To attain the third object of the invention, there is provided a dynamic RAM which comprises:

a semiconductor substrate;

a MOS transistor formed on the substrate, each MOS transistor having a source, a drain and a gate as a word line;

a trench region, having a convex portion for blocking leakage currents, formed near the MOS transistor on the substrate and covered by an insulating layer;

a capacitor formed in the trench region, the capacitor comprising a plate electrode, a capacitor insulating layer and a storage node electrode connected with one of the source and drain of the MOS transistor; and a bit line perpendicular to the word line, coupled with the other of the source and drain of the MOS transistors.

BRIEF DESCRIPTION OF THE DRAWINGS

Other objects and advantages of the invention will be apparent from the following description, taken in conjunction with the accompanying drawings, in which.

DESCRIPTION OF THE PREFERRED EMBODIMENT(S)

Figure 2:
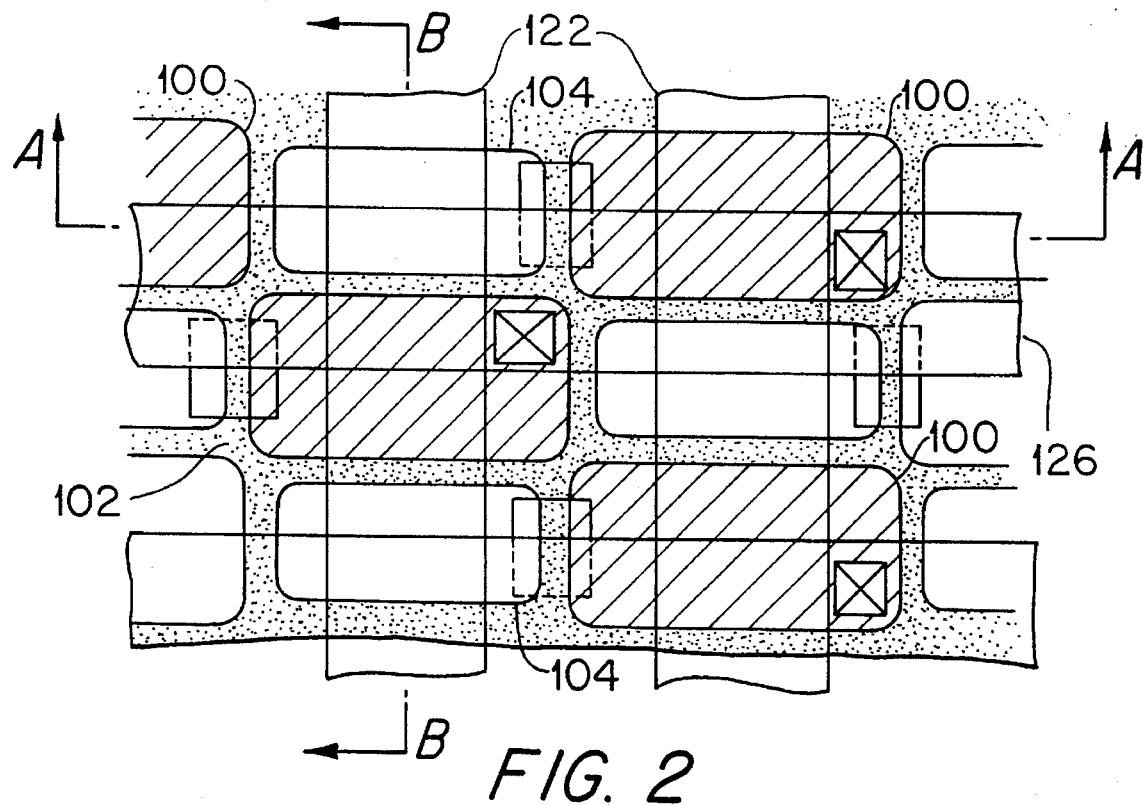
FIG. 2 shows a schematic plane view of the first embodiment.
Figure 3:
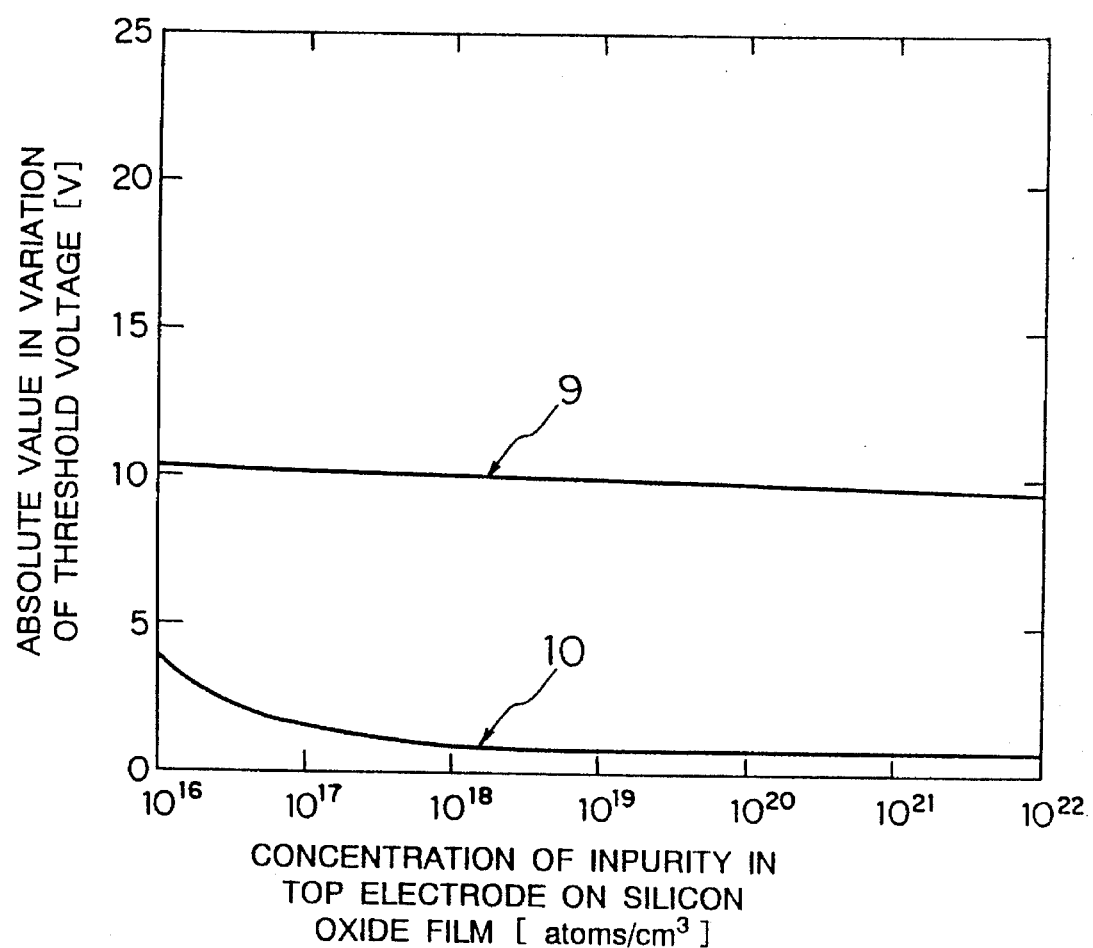
FIGS. 3A and 3B show schematic sectional views of the first embodiment, taken along respective lines A—A and B—B in FIG. 2.

A DRAM according to the first embodiment of the invention, which we call SIMPLE (Surrounding Isolation-Merged Plate Electrode) cell, will not be described, with reference to FIG. 2 and FIGS. 3A and 3B.

FIG. 2 shows a schematic plane view of the first embodiment, which is applied to DRAMs with an open bit line architecture.

FIGS. 3A and 3B are sectional views of lines A—A and B—B in FIG. 2 respectively.

In this embodiment, as shown in FIG. 2, Si island regions 100, on which MOSFETs are formed, are arranged in an array of checker patterns. The Si island regions 100 are formed like closely packed Si pillars.

However, the corner portion of each island region does not make contact with that of the adjacent island regions. The distance between the corners of Si island regions is narrower than the design rule. The size of the island region is 0.25 μm×0.5 μm.

Trench regions 104 are arranged in an array between the adjacent island regions 100, to form another checker pattern.

Capacitors are formed in the trench regions 104. A DRAM having a plurality of memory cells has one of the island regions and the trench region adjacent to the island region. According to this structure, an extremely small cell area of $4F^2$ is provided, which is 50% of that of the conventional $8F^2$ cell (F: feature size).

An important feature is that the embodiment is based on these closely packed structures of Si island regions 100.

As shown in FIGS. 3A and 3B, trenches 104 and island regions 100 are formed on a surface of a p type Si substrate 108, to make the checker pattern, such as in FIG. 2.

A plate electrode of poly Si layer 102 is formed in each trench 104 through a 50 nm thick $SiO_2$ layer 112 formed on the substrate. A storage node electrode 114, made of poly Si, is formed on each plate electrode 102 through a $SiO_2$ layer 110, whereby the capacitor is refilled in each trench 104.

Each storage node electrode 114 is coupled with one of the n type diffusion layers (source/drain) 116 of MOSFET 118 by forming a storage node contact pad of poly Si 120, which is covered by $SiO_2$ layer 128. Each MOSFET 118 has a gate electrode 122 functioning as a word line, whose side wall and the upper surface are covered by an SiN layer 124. The other diffusion layer 116 is coupled with a bit line 126 which is perpendicular to word lines 122.

A noteworthy thing in the structure is that each storage node electrode 114 is respectively isolated by the $SiO_2$ layer 112 and plate electrode 102, so leakage currents between memory cells are prevented. Each trench region 104 plays the role of the field isolation region as well as the capacitor region, so the field isolation area can be extremely reduced.

FIG. 4 to FIG. 9 show a process for making the embodiment. Each figure A and figure B corresponds to the sectional views taken along lines A—A and B—B in FIG. 2, respectively.

Figure 4A:
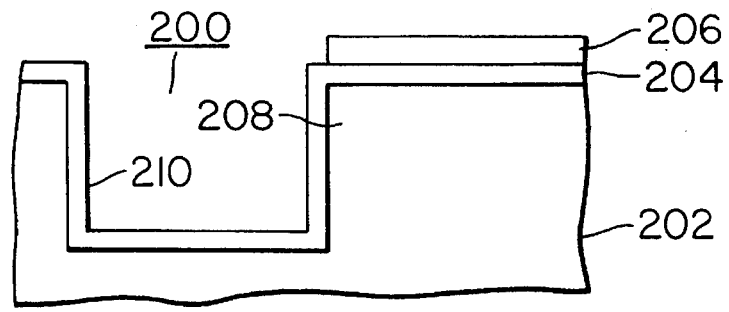
FIG. 4A to FIG. 9B are sectional views of a process for making the first embodiment, taken along respective lines A—A and B—B in FIG. 2.
Figure 4B:
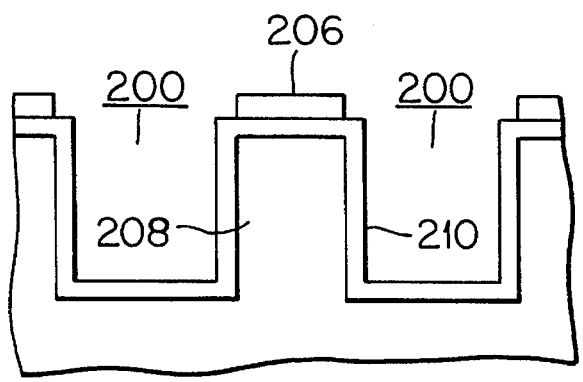

As shown in FIGS. 4A and 4B, trenches 200 are formed on the surface of a p type Si substrate 202, by using a stacked layer of SiN layer 204 and SiO$_2$ layer 206 as an etching mask. The resistivity of the substrate is 5 Ωcm. The etching mask is formed beforehand by RIE, using photo resist patterns as a mask, which are patterned checker patterns.

At the same time, Si island regions 208, which are arranged in an array of checker patterns, are formed.

The distance between the corner of Si island regions is narrower than the design rule. The distance can be well controlled by exposure time in the lithography process.

According to the step, each trench 200 has a wider portion at its center and a narrower portion at its corner.

An 80 nm thin SiO$_2$ layer 210 is formed on the bottom surface of each trench 200 and the surface of island regions 208 by the thermal oxidization method.

Figure 5A:
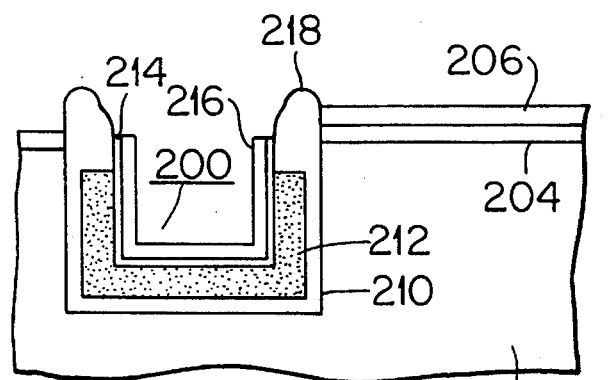
Figure 5B:
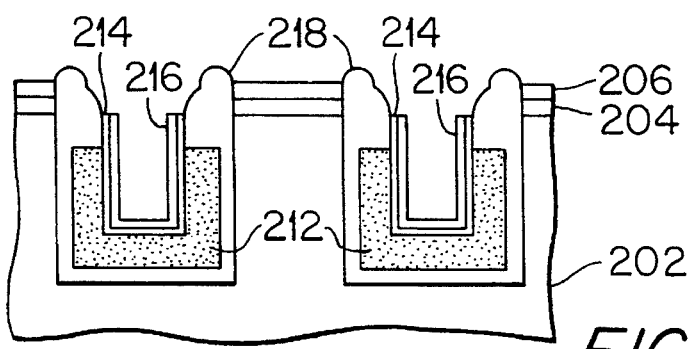

Then, as shown in FIGS. 5A and 5B, a plate electrode 212 made of poly Si is formed by the CVD method, so that a hole, in which a storage node electrode will be made, is formed in each trench. Each corner portion of the trench is refilled with poly Si 212 completely. The SiO$_2$ layer 210 and plate electrode 212 surround the Si islands 208 so as to be connected with each other at the corners.

According to this structure, each island region 208 is isolated by plate electrode 212 and a thin SiO$_2$ layer. Capacitor areas are formed and are self aligned with the Si island regions.

A resist layer (not shown in the figures) with a desired thickness is formed in the trenches, then an anisotropic etching, such as RIE, is processed to remove poly Si 212 formed on the top surface of Si islands. A this time, poly Si 212 formed on the sidewall and the bottom portion of the trenches remain.

Moreover, a thin SiO$_2$ layer 214 and a thin SiN layer 216 are formed to cover the remaining poly Si layer 212 and a thick SiO$_2$ layer 218 is formed at the corner portion of the trenches by a known local oxidation process (LOCOS method).

After the SiN layer 216, 206 and SiO$_2$ layer 214 are removed, As (arsenic) or P (phosphorus) ions are injected to plate electrodes 212 by a known implantation process.

Figure 6A:
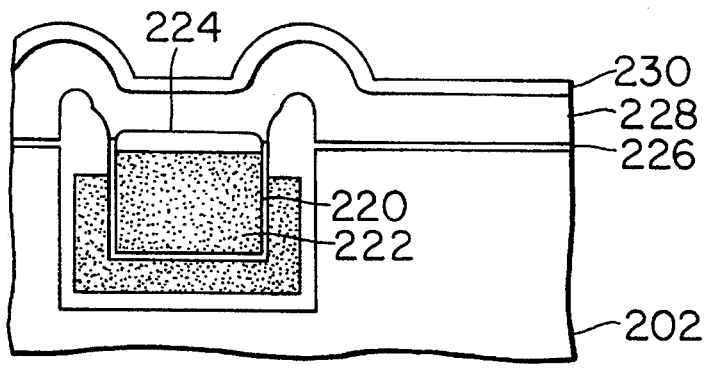
Figure 6B:
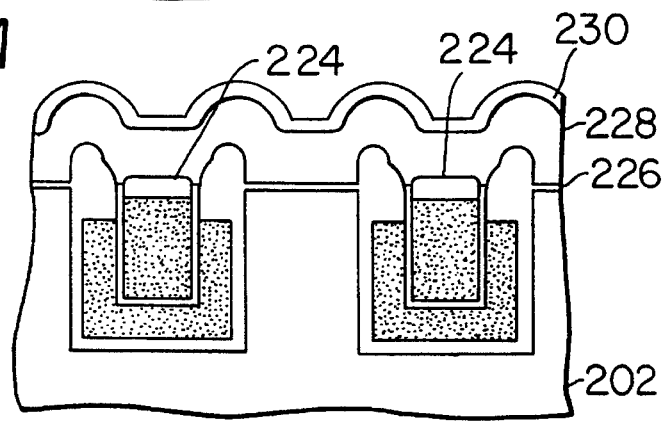

Then, as shown in FIGS. 6A and 6B, a stacked capacitor insulating layer 220, of SiN/SiO$_2$ is formed. Then, a P doped poly Si layer 222, as a storage node electrode, is deposited in the holes to refill the trenches. Then the storage node electrode 222 is capped by SiO$_2$ layer 224 by an oxidation step.

Capacitor insulating layer 220 formed on the top surface of Si island regions is removed and SiO$_2$ layer 224 is reformed by an oxidation in a low temperature.

Then, gate insulating layer 226, poly Si layer 228, which will be a gate electrode afterward, and SiN layer 230 are formed in this order on the whole surface of the substrate.

Figure 7A:
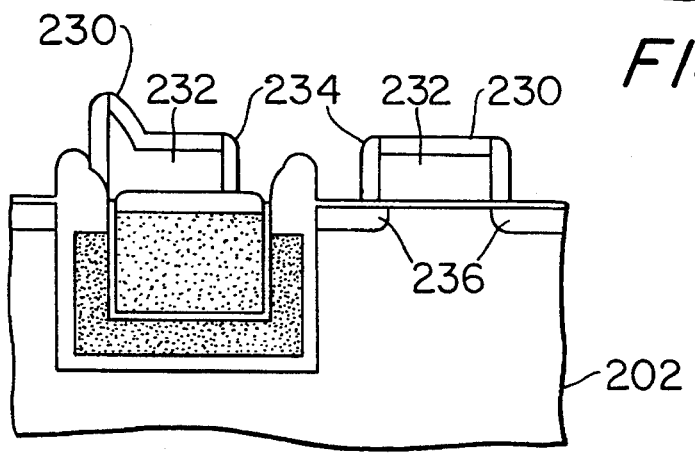
Figure 7B:
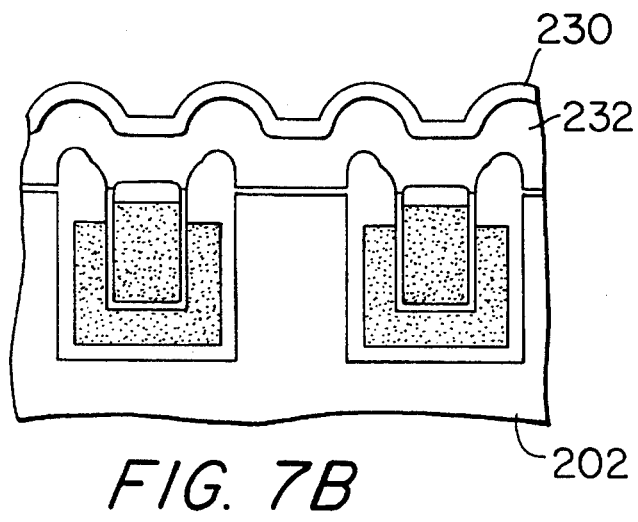

The next step is shown in FIGS. 7A and 7B. Poly Si layer 228 is pattern to form the gate electrode 232, by using SiN layer 230 as a mask. The side wall of the gate electrode is covered with SiN layer 234. Then, As implantation is made in a self-aligning manner by using the gate electrode as a mask to form an n type source and drain diffusion regions 236.

Figure 8A:
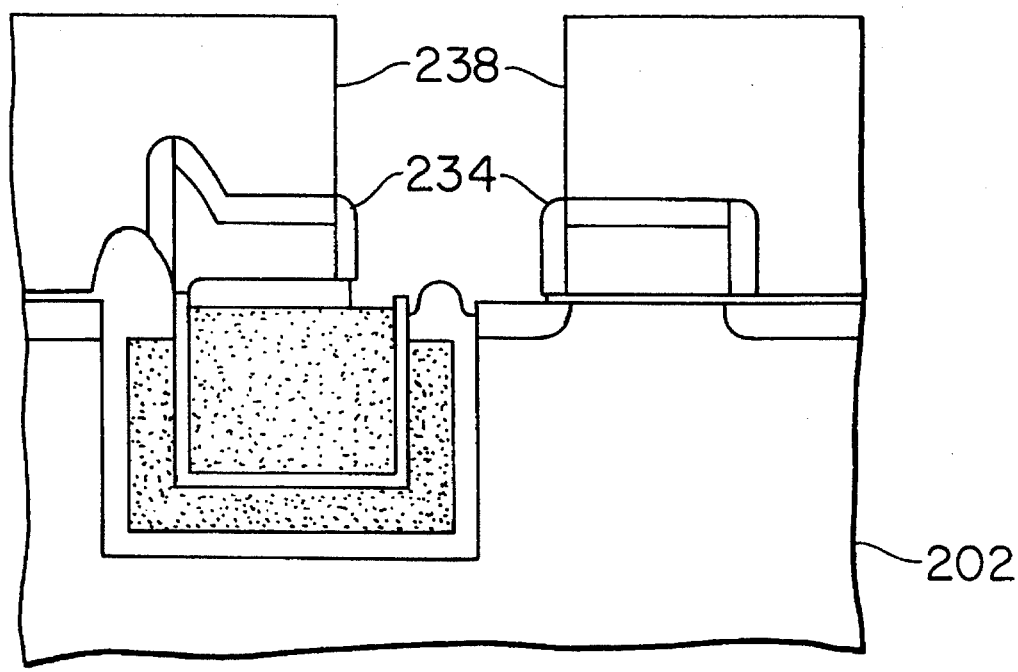
Figure 8B:
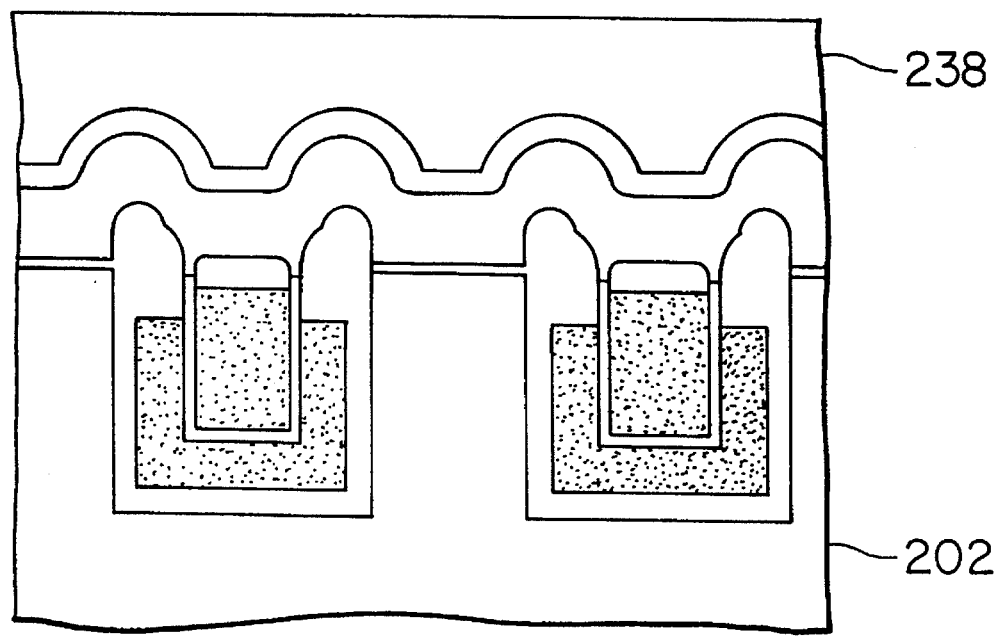

Then, as shown in FIGS. 8A and 8B, a desired resist pattern 238 is formed by a known lithography process. Resist pattern 238 is used as a mask to etch the SiO$_2$ layer on which a storage node contact pad will be formed afterward.

In this process, as the side wall of the gate electrode 232 is covered with SiN layer 234, electrical shorts between the contact pad and gate electrode 232 can be prevented by selecting the more high etching selectivity against the SiN layer.

Figure 9A:
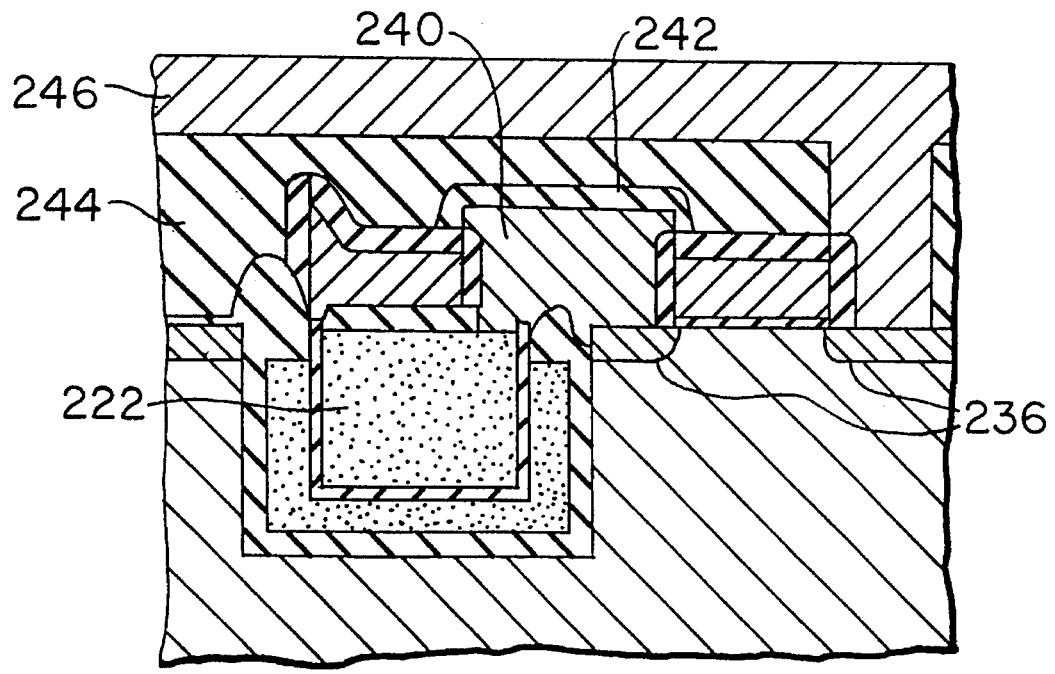
Figure 9B:
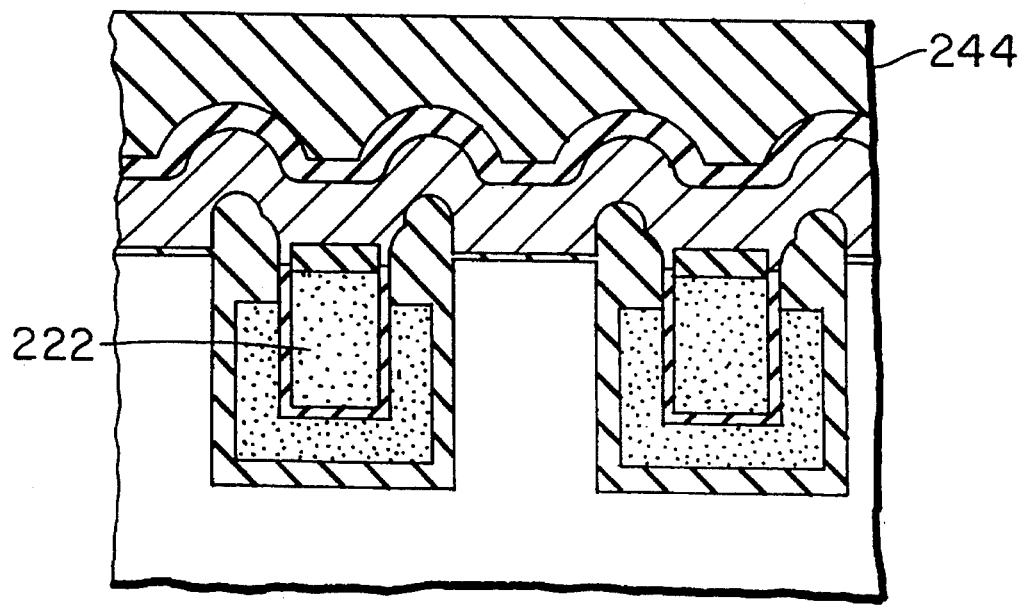

Finally, as shown in FIGS. 9A and 9B, the contact pad of poly Si 240 which connects storage node electrode 222 to one of the diffusion regions 236 is formed and the surface of the contact pad 240 is covered with SiO$_2$ layer 242 by an oxidation process.

A BPSG layer 244 is formed on the whole surface of the substrate, whereby the surface is planarized. After that, a bit line 246 to connect with the other diffusion region 236, is formed. Then, the whole surface of the substrate is covered with a passivation layer (not shown in the figures). The DRAMs are thus completed according to the above processes.

According to this embodiment, the capacitor is refilled in each trench and the island regions formed in checker patterns are isolated by plate electrode 212 and SiO$_2$ layer 210, 218 respectively.

Accordingly, the memory cell area can be reduced and reliable DRAMs can be obtained by using less complex manufacturing process.

Figure 10:
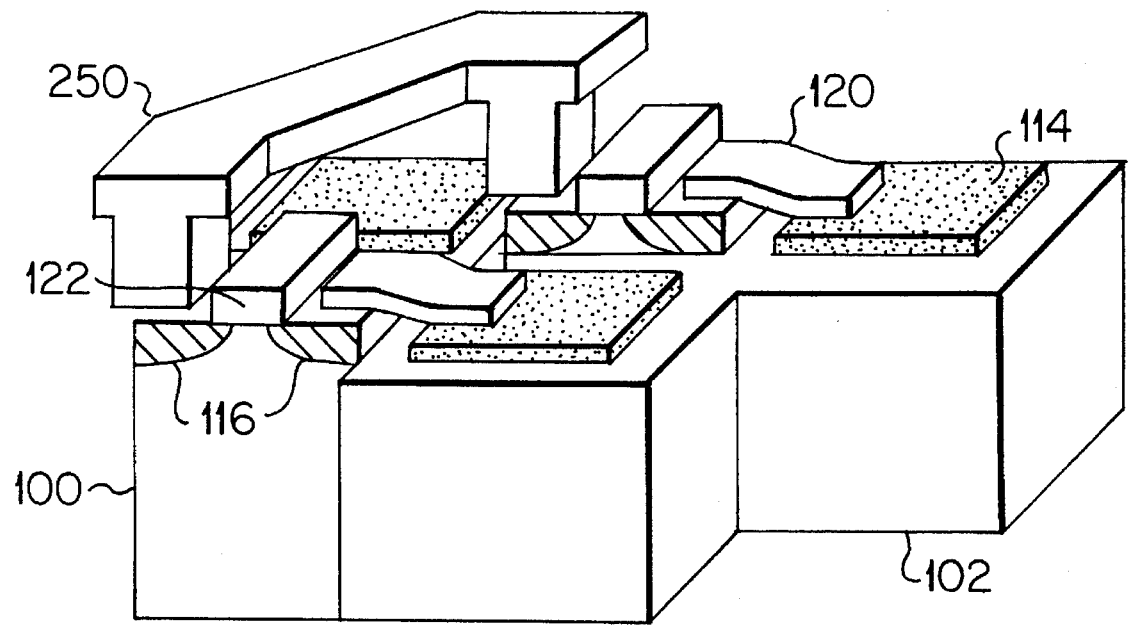
FIG. 10 shows a schematic perspective view of the first embodiment.

FIG. 10 shows a schematic perspective view of the present first embodiment. Bit lines 250, which connect two adjacent memory cells, are bent, but the other elements are the same as the first embodiment. The same reference numbers are attached to the same elements shown in FIG. 3.

Figure 12:
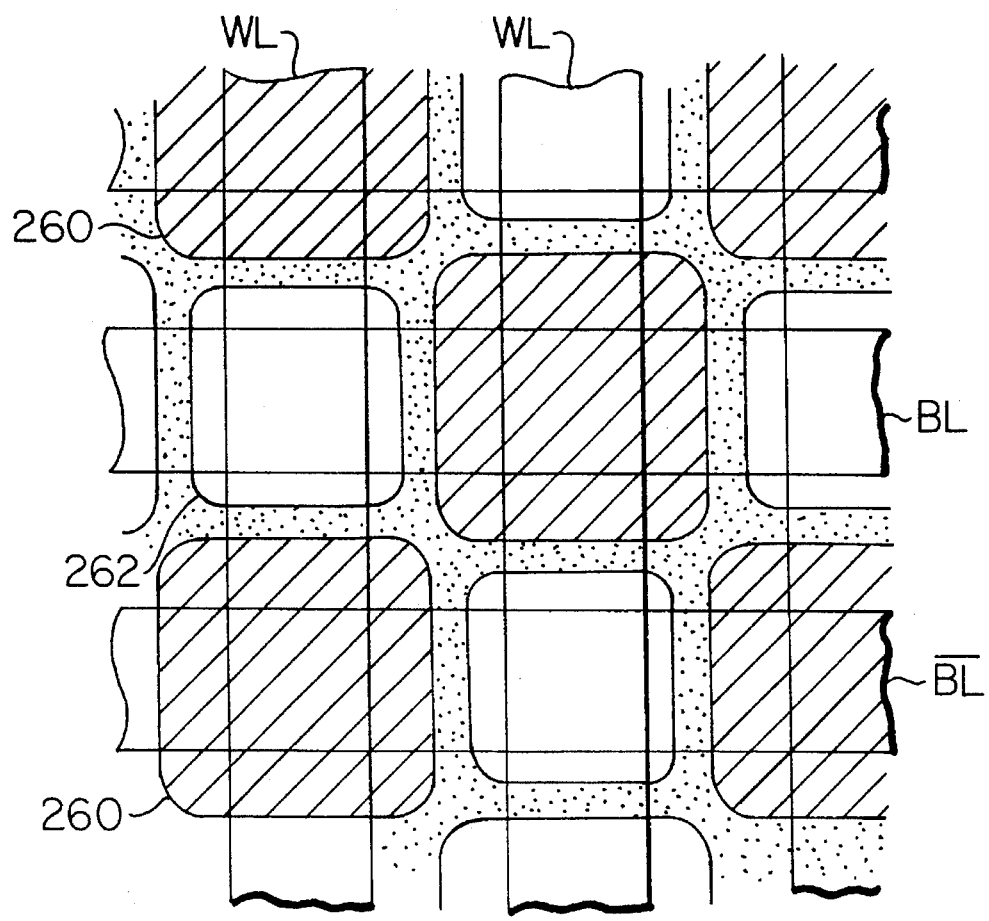
FIG. 12 shows a schematic plane view of a first modification of the first embodiment.

FIG. 12 shows a schematic plane view of a first modification of the present first embodiment.

In the modification, bit lines are arranged in an array of a folded bit line architecture. That is, a bit line BL and the adjacent bit line /BL are folded at a sense amplifier (S/A) (not shown in the figure) and these lines work as a pair of bit lines.

In this modification, island regions 260 and trench regions 262 must be formed to be larger than the first embodiment because the bit line cannot be shared by two array of adjacent island regions and this formula must ensure a distance between two adjacent bit lines BL, /BL.

Accordingly, the cell size will not be smaller than that of the conventional cells, but this modification can be also practical. Because storage node electrodes are surrounded by the plate electrodes and the SiO$_2$ layer and are isolated completely, the same as the first embodiment, the problem of the leakage currents can be reduced.

Figure 11A:
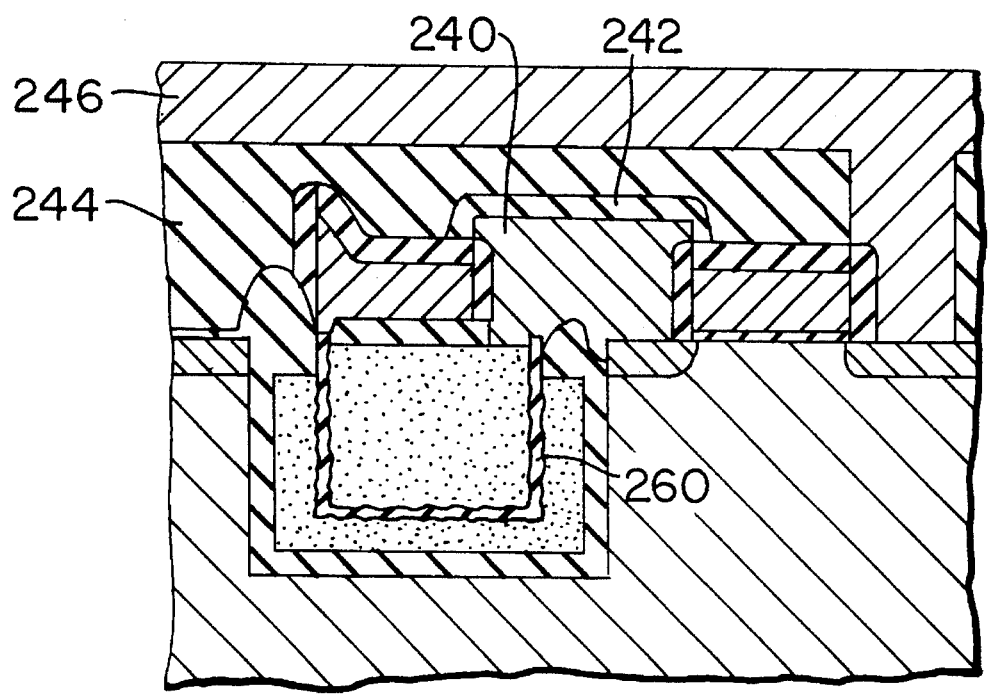
FIGS. 11A and 11B show schematic sectional views of a second modification of the first embodiment, taken along respective lines A—A and B—B in FIG. 2.
Figure 11B:
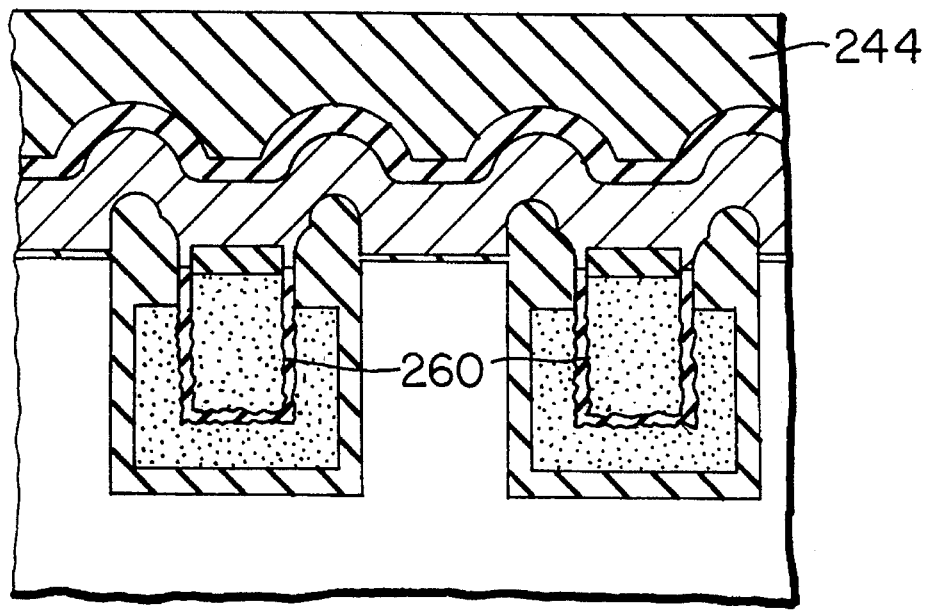

FIGS. 11A and 11B shows a schematic sectional view of a second modification of the first embodiment.

As shown in FIGS. 11A and 11B, the surface of a plate electrode 260 is made rough to increase the capacitance of the DRAMs. The second modification can be also combined with the first embodiment.

The second embodiment of the present invention will be described with reference to FIG. 13 and FIG. 14.

Figure 13:
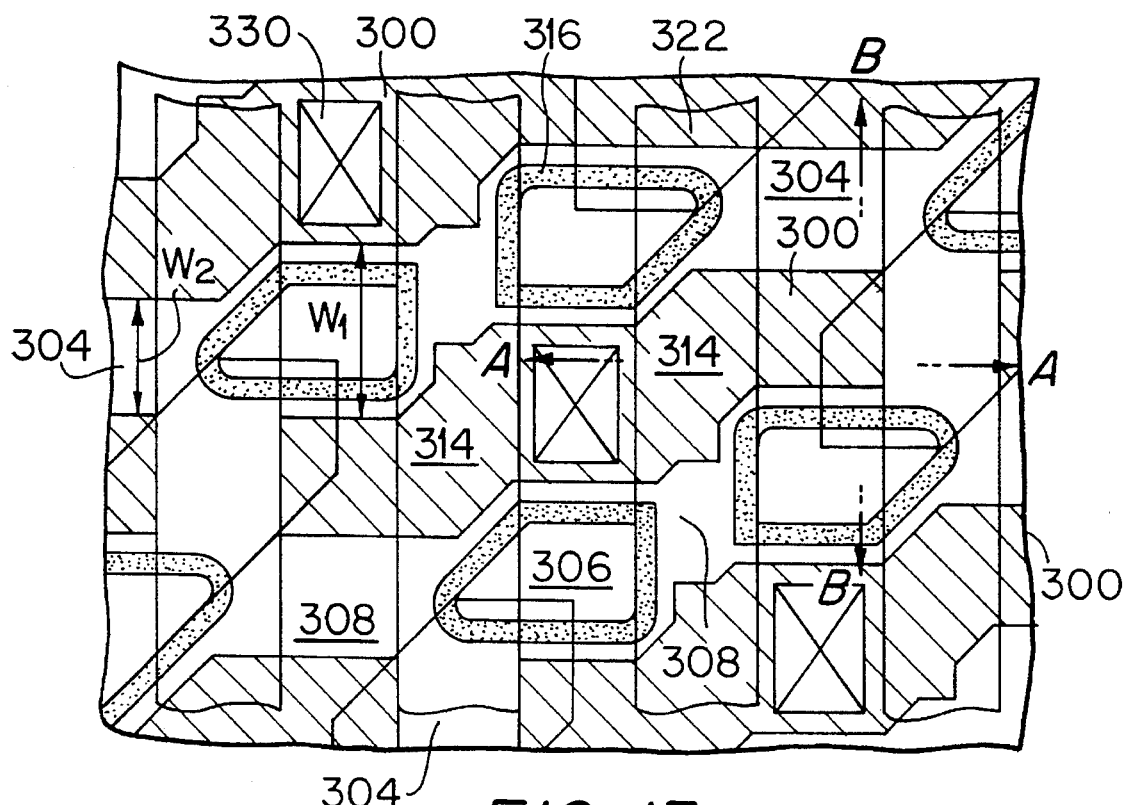
FIG. 13 shows a schematic plane view of the second embodiment.

FIG. 13 is a schematic plane view of the second embodiment.

Figure 14A:
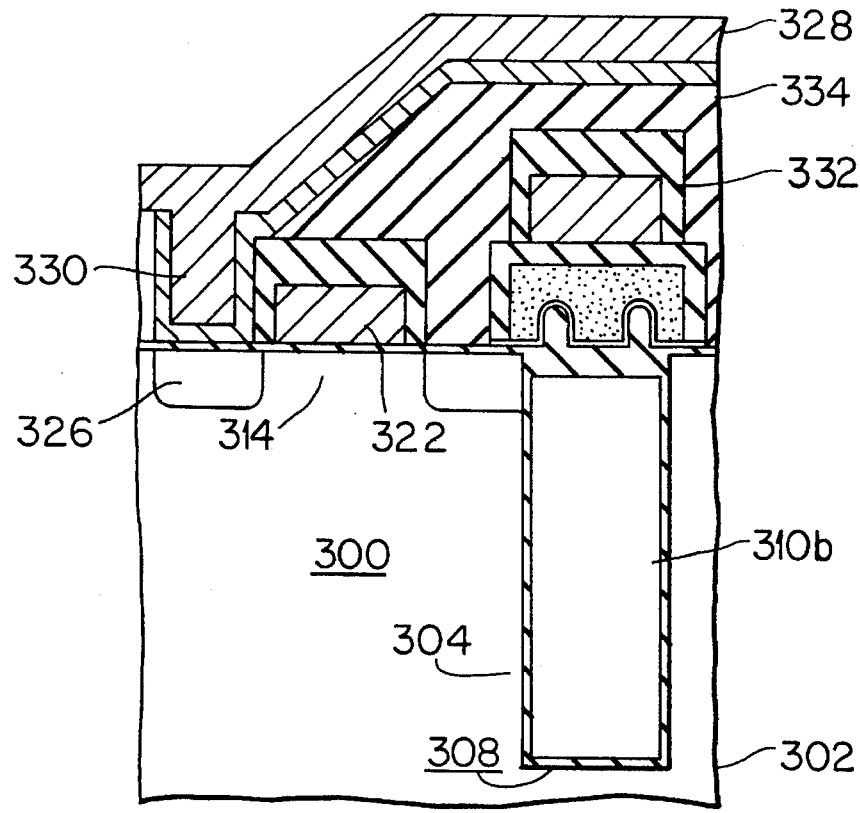
FIGS. 14A and 14B show schematic sectional views of the second embodiment, taken along respective lines A—A and B—B in FIG. 13.
Figure 14B:
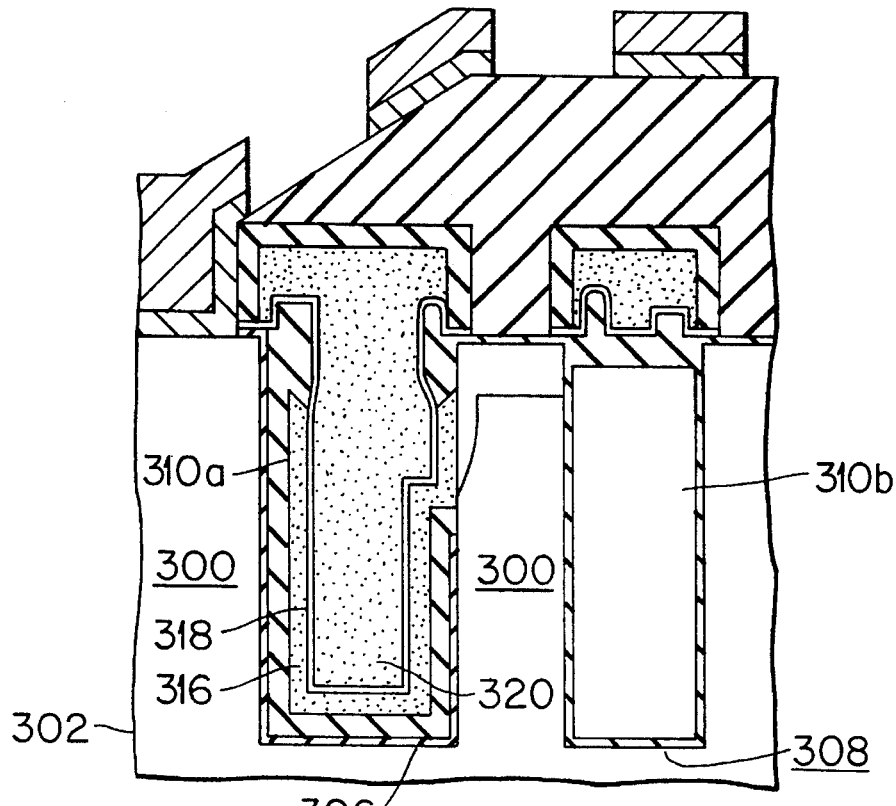

FIGS. 14A and 14B show sectional views of lines A—A and B—B in FIG. 13, respectively.

As shown in these figures, island regions 300 (shown with oblique lines) are formed vertically and horizontally on a p type Si substrate 302. Two MOSFETs 314 are going to be formed on the island regions 300.

The other regions on the substrate form trench regions 304, which have a first trench portion 306 and a second trench portion 308, wherein the width (W1) of the first trench portions 306 are formed to be larger than the width (W2) of the second trench portion 308. The first portion and the second portion are going to be capacitor regions and field isolation regions, respectively.

The first wider portions 306 are partially refilled with an insulating material 310a to form a hole in each trench 306, but the second narrower portions 308 are completely refilled with a second insulating material 310b, such as non-doped poly Si.

The insulating material 310a is formed by oxidizing the second material 310b. A capacitor area is formed in each first trench portion 306 by making use of the configuration of the trench portions.

In the first trench portions 306, storage node electrodes 316 of poly si, capacitor insulating layer 318, and plate electrodes 320 of poly si are formed in this order. Each plate electrode 320 has an overhang portion on the surface of the island regions to increase the capacitance.

Another structure is similar to a known DRAM. Gate electrode 322 of the MOSFET, used as a word line, is arranged in an array in one direction continuously in the memory cell matrix. Bit line contact 330 is formed on one of the diffusion layers 326, which is at the center of the island regions 300. The other diffusion layer 326 is coupled with storage node electrode 316 through a storage node contract. CVD $SiO_2$ layer 332 and BPSG layer 334 are formed on the surface of the substrate.

Bit line 328, which consists of poly si layer 328a and silicide layer 328b, (not shown in FIG. 13, but shown in FIG. 14) run through and are perpendicular to the word line 322.

FIG. 15 to FIG. 21 show schematic sectional views of the manufacturing process of the second embodiment.

Each figure A and figure B corresponds to the sectional views taken along lines A—A and B—B in FIG. 13, respectively.

Figure 15A:
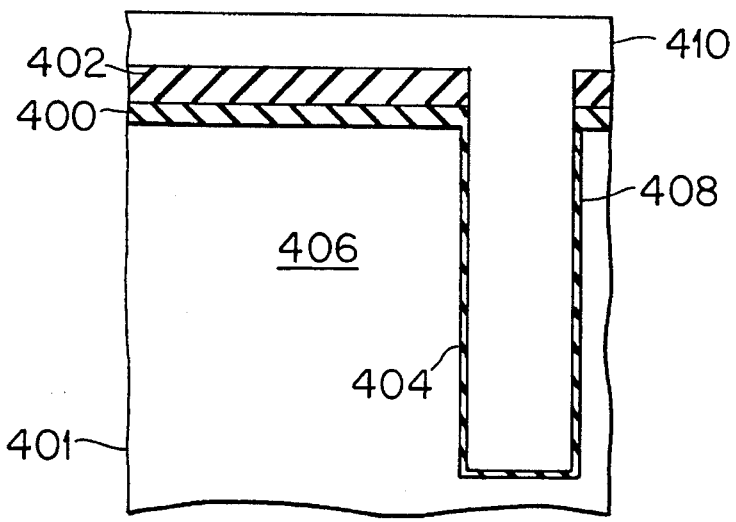
FIG. 15A to FIG. 21B are sectional views of a process for making the second embodiment taken along respective lines A—A and B—B in FIG. 13.
Figure 15B:
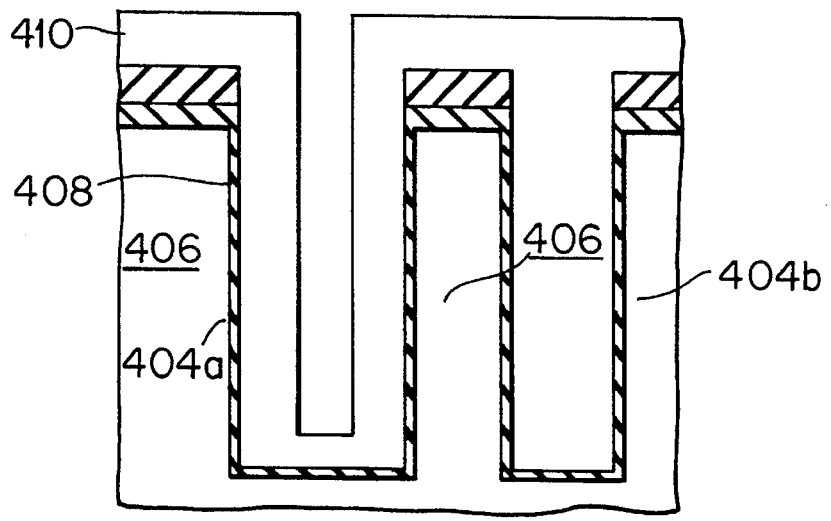

As shown in FIGS. 15A and 15B, over a stacked layer, made by SiN layer 400, $SiO_2$ layer 402 is patterned on a p type si substrate 401 (resistivity is about 5 Ωcm), to cover device regions formed afterward.

Trench regions 404 are formed by RIE, using the stacked layer as the etching mask. At the same time, a plurality of island regions 406 are formed on the substrate.

In this process, it is important that trench regions are formed so as to have the first trench portions 404a and the second trench portions 404b, wherein the width of the first trench portions is wider than that of the second trench portions.

Then, an 80 nm thick $SiO_2$ layer 408 is formed on the inner surface of the trenches by thermal oxidation. Then, a poly Si layer 410 is deposited on the substrate such that narrower trench 404b is refilled with poly Si layer 410 completely, but wider trench 404a is not fully refilled, to leave a hole in each first trench.

Figure 16A:
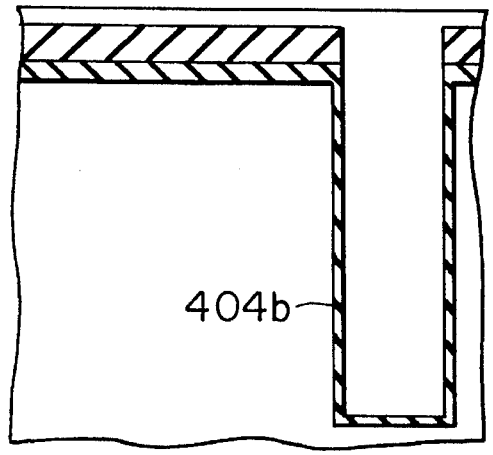
Figure 16B:
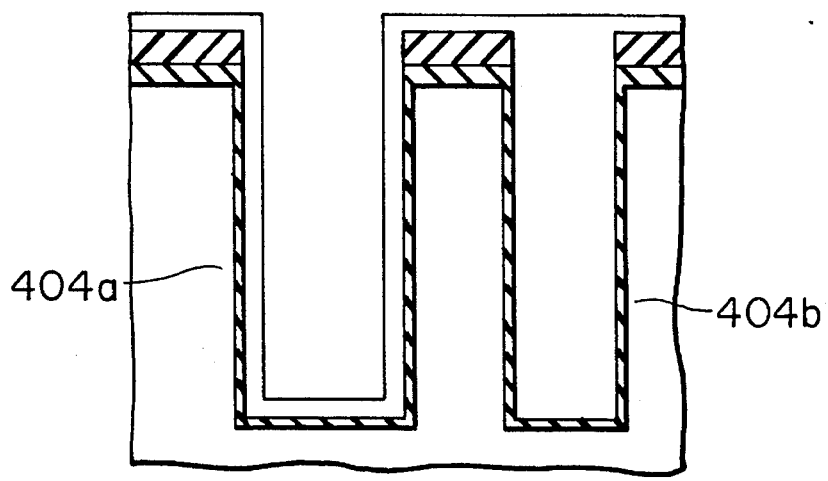

An isotropic wet etching, using $NH_4$ OH solution, is processed, such that poly Si layer 410 on wider trench 404a is etched. By this process, the width of the wider trench opening is enlarged, as shown in FIG. 16. Poly Si layer 410 in each narrower trench 404b remains refilled.

The isotropic etching can be processed also by chemical dry etching. If very thin Si layer 410 is formed in the deposition process, this process can be deleted.

Figure 17A:
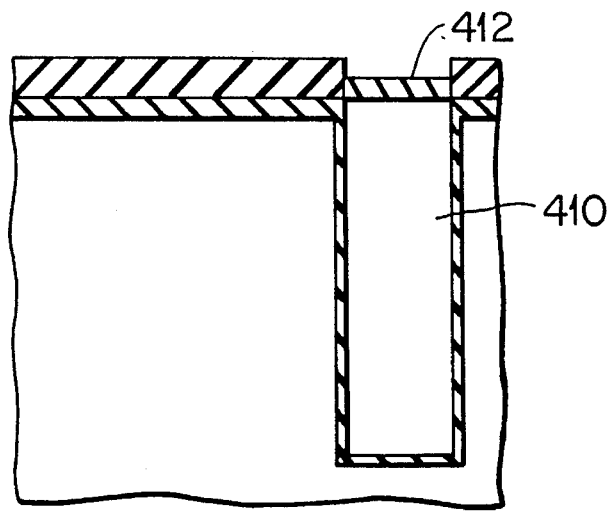
Figure 17B:
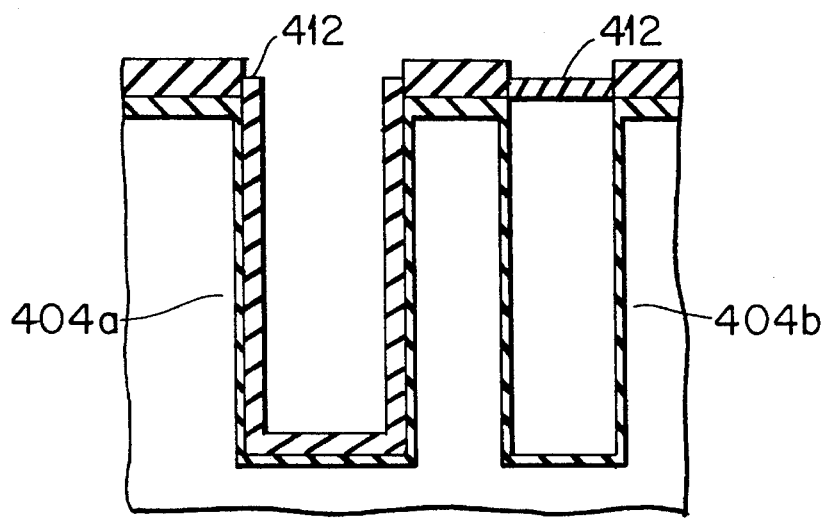

Then, as shown in FIGS. 17A and 17B, a $SiO_2$ layer 412 is formed by oxidizing the poly Si 410. In the first trench 404a, poly Si layer 410 is changed to the $SiO_2$ layer 412 completely. In the second trench 404b, the surface of the poly Si layer 410 is changed to the $SiO_2$ layer 412 and the second trench is formed to a field isolation region.

Figure 18A:
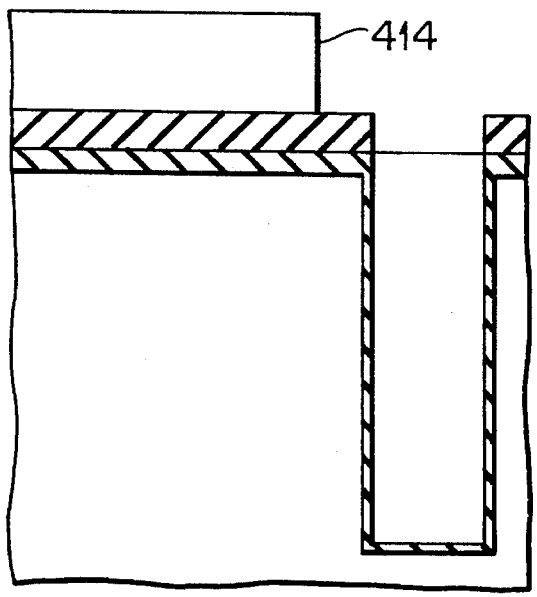
Figure 18B:
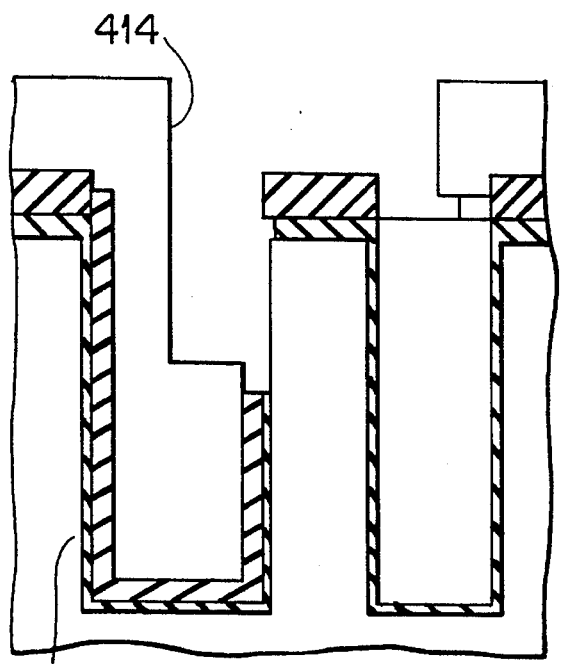

As shown in FIGS. 18A and 18B, a resist pattern 414 to form a storage node contact is formed on the substrate. A part of the $SiO_2$ layer 412 at the side wall of the first trench 404a is removed in order to expose the Si surface for a storage node contact.

Figure 19A:
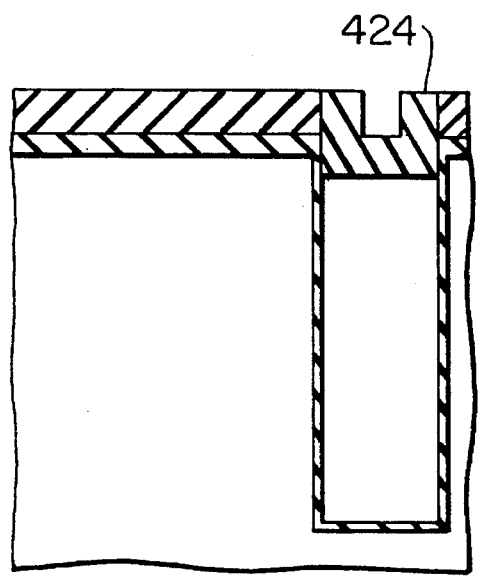
Figure 19B:
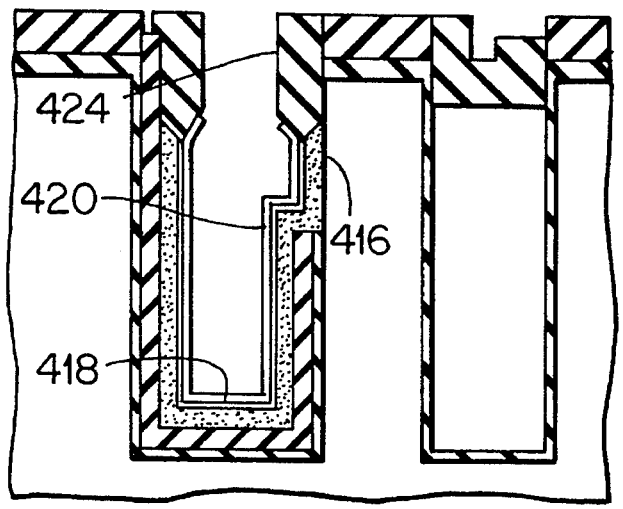

The next step is shown in FIGS. 19A and 19B. After removing resist pattern 414, a 50 nm thick poly si 416 is deposited on the whole surface of the substrate by the CVD method. Then, a resist layer (not shown in the figures) is formed to cover poly si 416 formed on the bottom portion of wider trench 404a.

Then, poly si 416 at the surface of the substrate is removed by an anisotropic etching, such as RIE. The poly si 416 remains only at the bottom portion and the side wall of wider trenches 404a.

Moreover, after an $SiO_2$ layer 418 and a SiN layer 420 are formed on the poly Si 416 in the order, a local oxidation layer 422 is selectively formed at the upper portion of the trench 404a by the local oxidation process, which is similar to forming LOCOS field isolation. In this process, an oxidation layer 424 is also formed on the surface of narrower trench 404b.

Figure 20A:
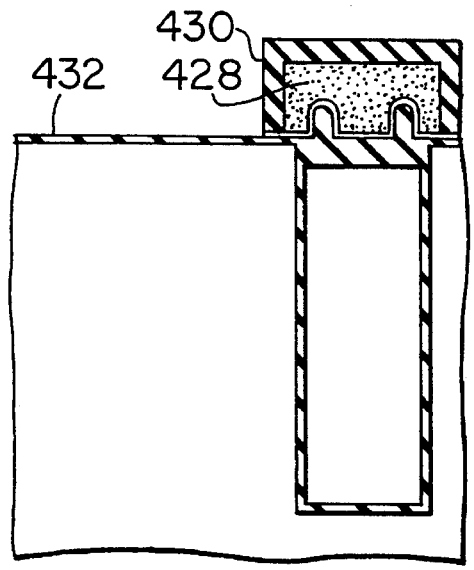
Figure 20B:
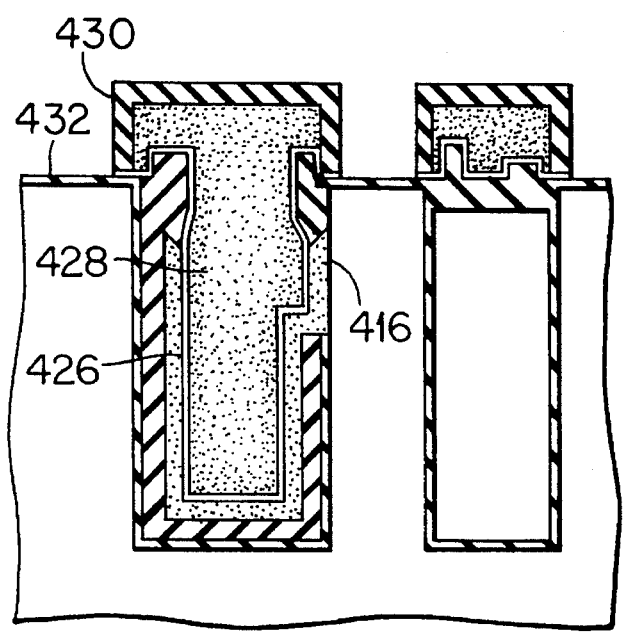

Moreover, as shown in FIGS. 20A and 20B, after removing SiN layer 400, 420 and $SiO_2$ layer 418, As or P ion implantation is performed to poly Si layer 416 to form a storage node electrode.

Subsequently, stacked capacitor insulating layers (SiN/$SiO_2$) 426 are formed on poly si layer 416. A plate electrode 428, which is made of poly si, is deposited at least on the capacitor insulation layer 426, whereby a capacitor is formed in each wider trench 404a. Plate electrode 428 is covered with an $SiO_2$ layer 430 by the oxidation method.

After capacitor insulating layers 426 on the top surface of the substrate and $SiO_2$ layer 402 are removed, $SiO_2$ layer 430 is reformed by a thermal oxidation in a low temperature. A gate insulating layer 432 is also formed on the device regions.

Figure 21A:
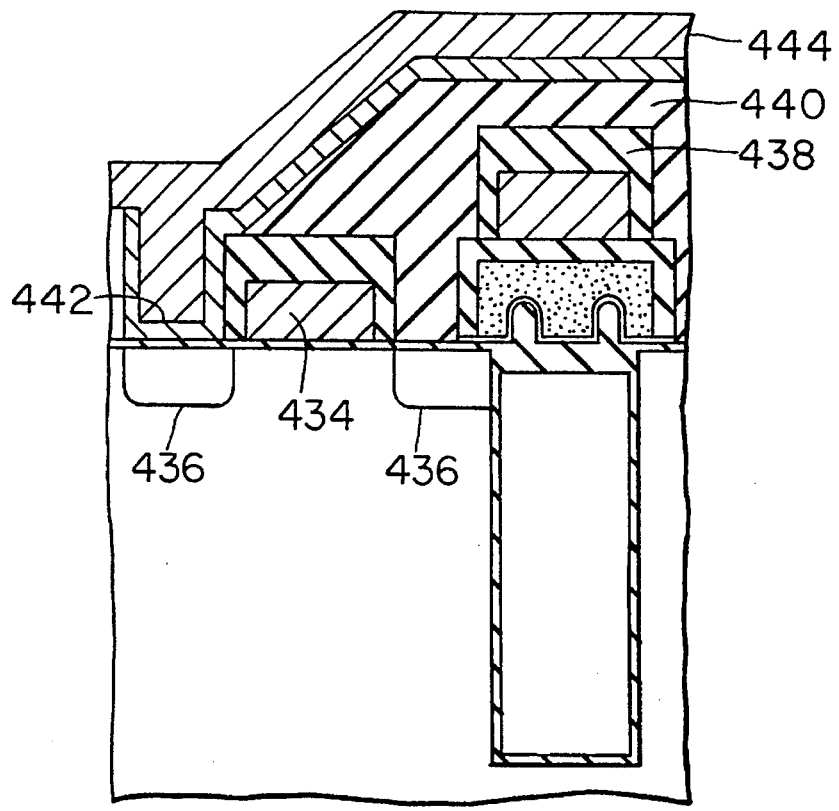
Figure 21B:
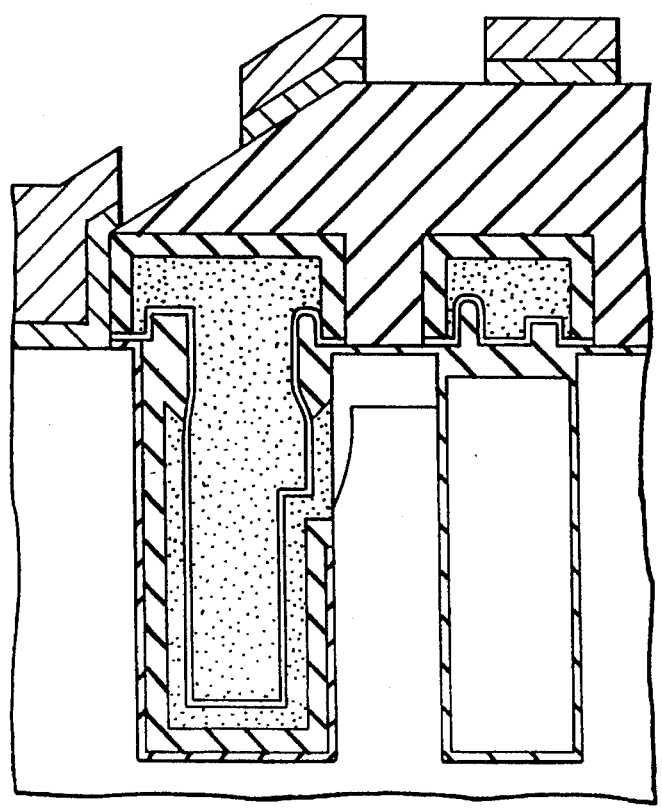

Then, as shown in FIGS. 21A and 21B, a gate electrode 434 made of poly si, which functions as a word line, is formed to go through island regions 406 toward one direction.

Then, As ion implantation is made to island regions 436 in a self-aligning manner by using gate electrodes 434 as the mask, whereby n type source/drain regions 436 are formed on each island region.

Finally, an $SiO_2$ layer 438, as an interlayer insulator, and a BPSG layer 440, planarizing the surface of the substrate, are formed. Then, bit line contacts 442 are formed to reach one of n type regions 436, which is not connected with storage node electrode 416. The, bit line 444, consisting of poly Si layer and silicide layer, is formed, and as shown in FIGS. 21A and 21B, the DRAM is completed.

According to the second embodiment, the leakage currents between memory cells can be decreased because the field isolation regions surrounding the island region are formed in the narrower trench in self alignment with the capacitor area in the wider trench. The trench region plays the roles of field isolation regions as well as capacitor regions.

The embodiment has another advantage in that the refilled material in the second trench portion is poly Si, so the thermal stress to Si substrate 401 can be decreased.

Figure 22A:
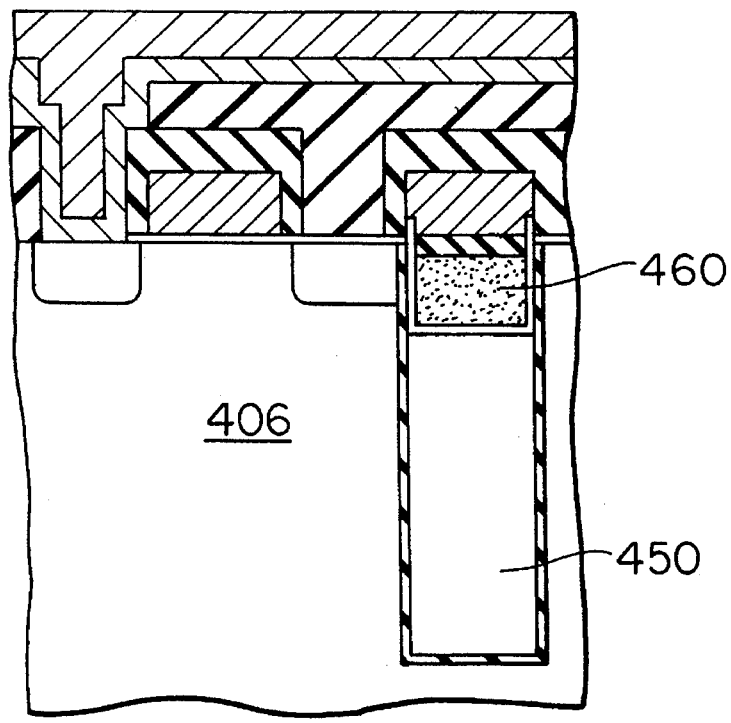
FIGS. 22A and 22B show schematic sectional views of a modification of the second embodiment.
Figure 22B:
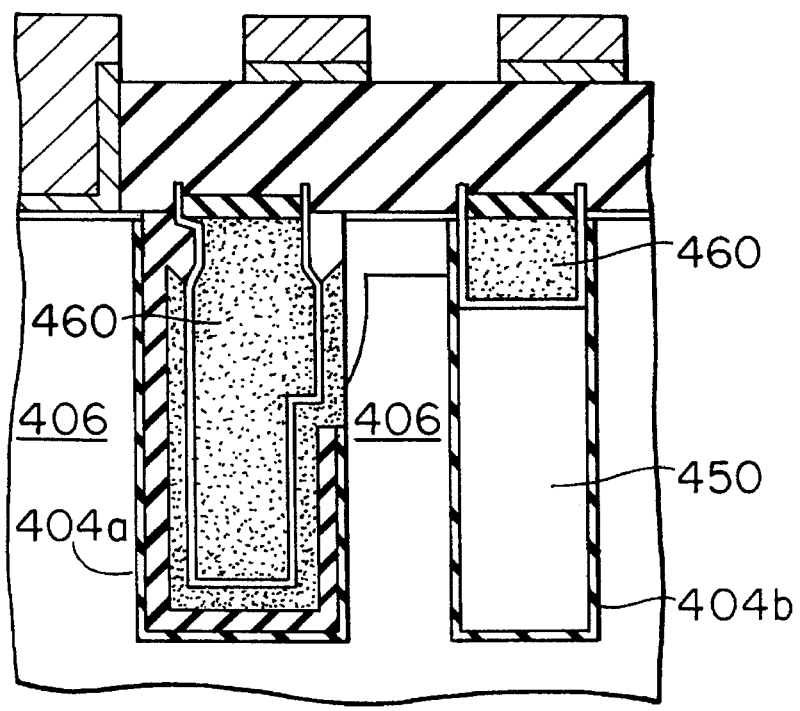

FIGS. 22A and 22B show sectional views of a modification of the second embodiment.

The modification is different from the second embodiment in that narrower trench 404b is refilled with an SiN layer 450 instead of poly Si.

The surface of the SiN layer 450 is set to be 300–400 nm below the surface of Si island regions 406.

Also plate electrodes 460 are refilled in wider trench 404a and narrower trench 404b, so as not to project above the surface of the island regions.

According to the modification, an additional advantage is that after making capacitors and field isolation regions, the surface of the substrate can be planarized. Hence, the disconnections of word lines or bit lines are not likely to occur.

The manufacturing method of the modification is almost the same as the second embodiment except that the SiN layer 450 is refilled in narrower trench 404b and the upper portion of SiN layer 450 is etched back. This etching process can be performed when SiN layer 420 is removed, as shown similarly in FIGS. 10A and 19B. Hence, the other detailed descriptions are omitted here.

Also, it will be possible to apply the method of planarization in the second embodiment.

Now, the third embodiment of the present invention will be described with reference to FIG. 23.

Figure 23A:
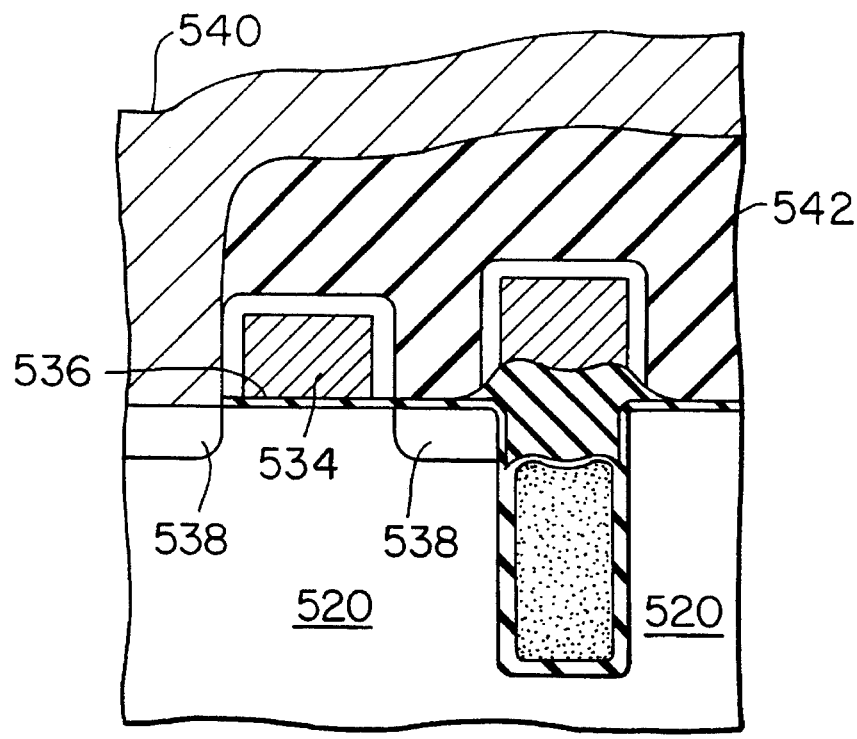
FIGS. 23A and 23B show schematic sectional views of the third embodiment, taken along respective lines A—A and B—B in FIG. 13.
Figure 23B:
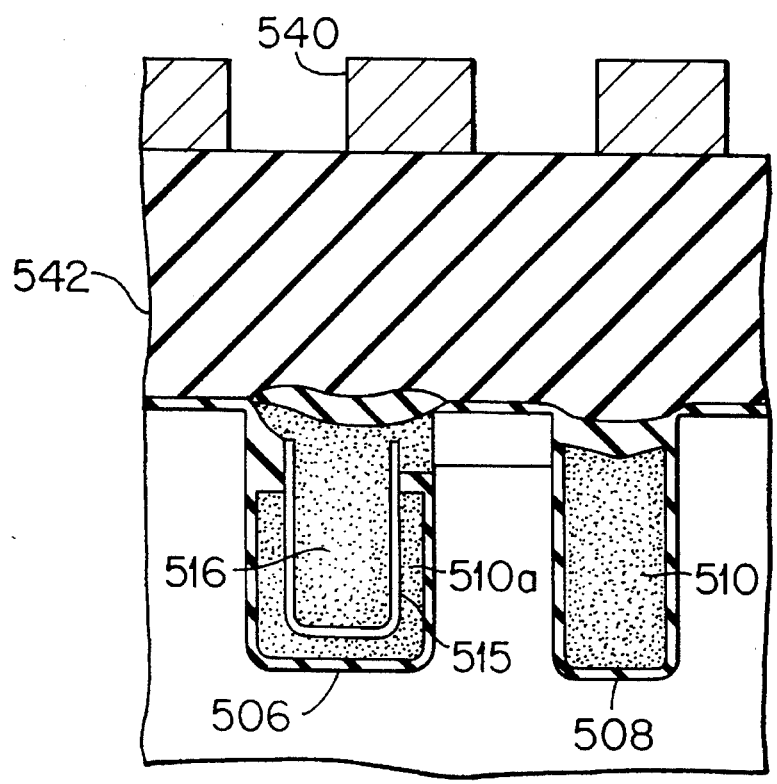

FIGS. 23A and 23B correspond to sectional views taken along lines A—A and B—B in FIG. 13.

This embodiment is similar to the second embodiment, but in this embodiment, as shown in FIG. 23, storage node electrode 516 is formed on plate electrode 510a in each wider trench portion 506. That is, the capacitor is refilled in each wider trench portions 506 and they are formed not to project over the surface of the island regions 520.

The remaining structure is almost the same as shown in FIGS. 14A and 14B of the second embodiment, so the detailed description is omitted.

FIG. 24 to FIG. 29 are sectional views of the significant steps in the manufacturing process of the third embodiment.

Figure 24A:
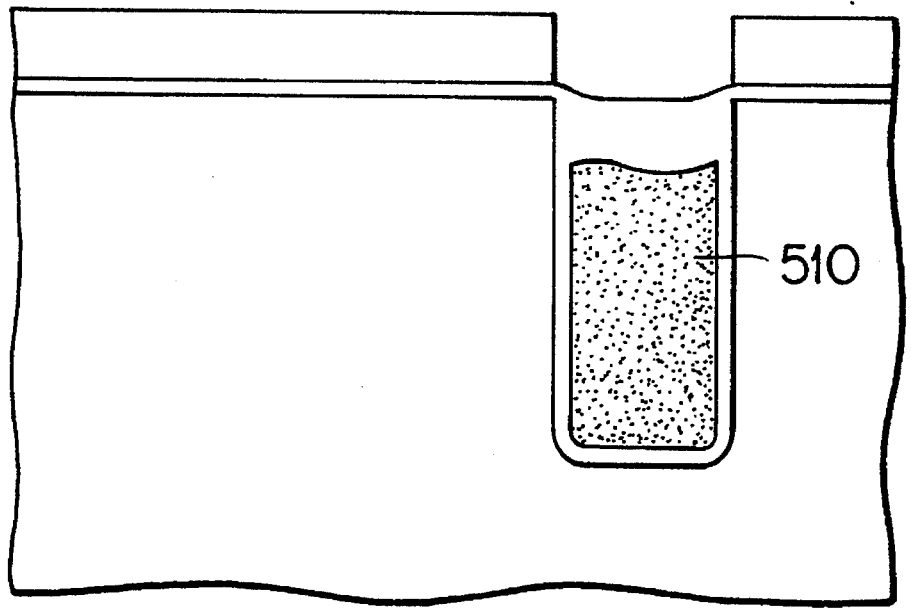
FIG. 24A to FIG. 29B are sectional views of a process for making the third embodiment, taken along respective lines A—A and B—B in FIG. 13.
Figure 24B:
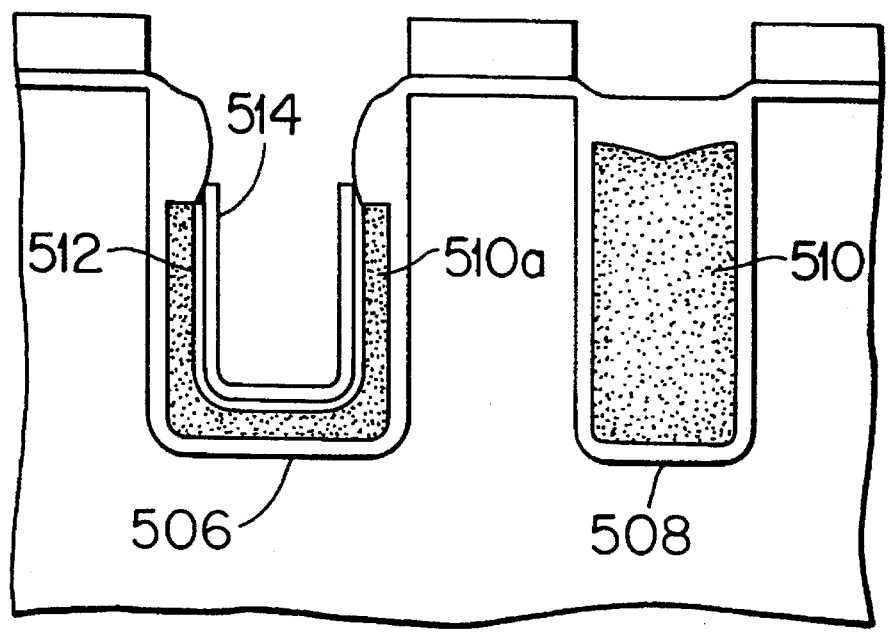

As shown in FIGS. 24A and 24B, the processes up to refilling wider trenches 506 and narrower trenches 508 with poly Si layers 510 and 510a are almost the same as the second embodiment. However, there is a difference in the third embodiment in that the poly Si 510a refilled in wider trenches 506 is formed as plate electrodes. The plate electrodes are formed on the bottom portion and sidewall of each wider trench 506 so as not to contact each other.

After poly Si 510a formed at the upper portion of wider trenches 506 are oxidized as in the second embodiment, by using SiN layer 512 and SiO$_2$ layer 514 as the mask, the mask 512 and 514 is removed. As or P implantation is made on the poly Si layer 510a in each wider trench 506.

Figure 25A:
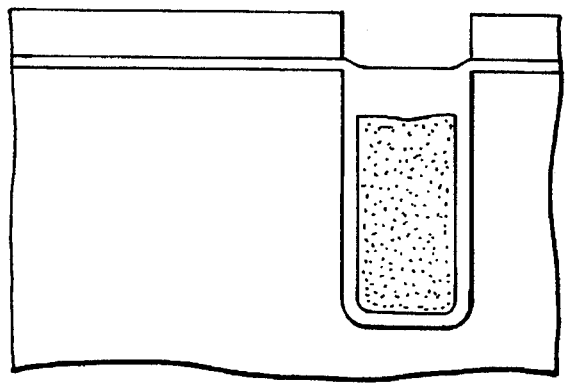
Figure 25B:
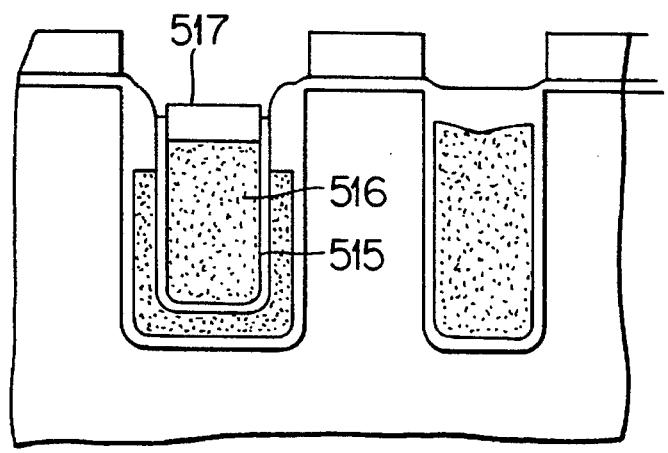

Then, as shown in FIGS. 25A and 25B, a capacitor insulating layer 515 is formed on poly Si layer 510a. Then, P doped poly Si 516, working as a first storage node electrode, is selectively formed on the capacitor insulating layer in each wider trench 506. Then, the surface of the poly Si 516 is covered by a thermal oxidizing layer 517.

Figure 26A:
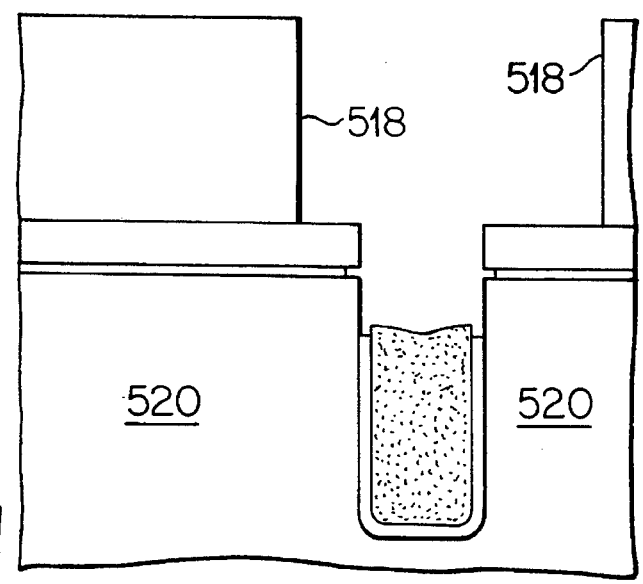
Figure 26B:
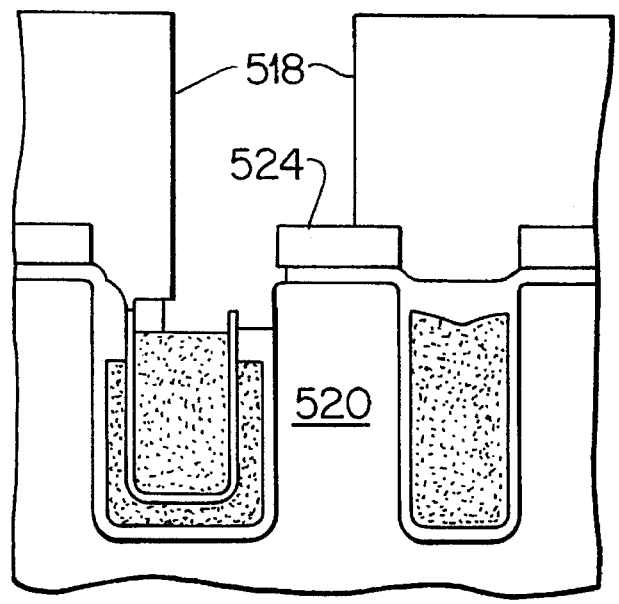

After resist patterns 518 for making storage node contacts are formed on the surface of the substrate, an anisotropic etching is processed, using the resist pattern as the mask, to expose a part of the side wall of each island region 520 and a part of storage node electrodes 156 (FIG. 26A and 26B). A storage node contact is formed afterward at these exposed parts. Then, a thin thermal SiO$_2$ layer 522 is formed on the exposed parts.

Figure 27A:
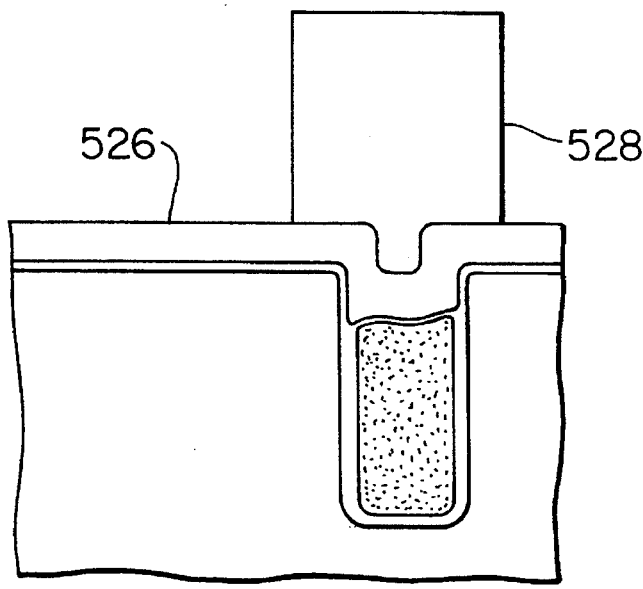
Figure 27B:
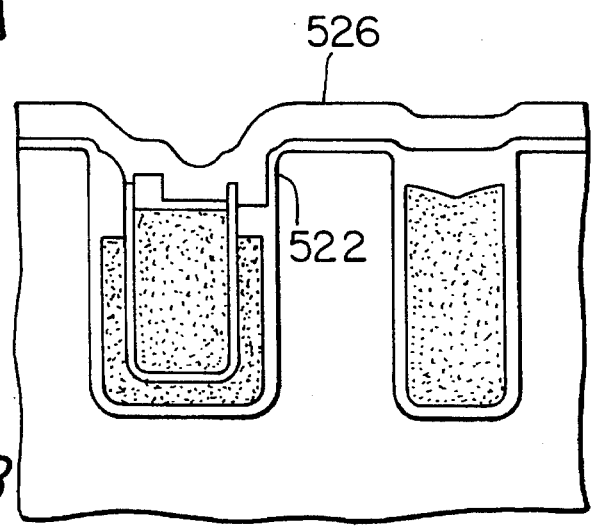

After removing resist patterns 518 and SiN layer 524, another SiN layer 526 is deposited over the whole surface of the substrate, as shown in FIGS. 27A and 27B. Resist patterns 528 are formed on each narrower trench portion 508, which is going to be a field isolation region, and then SiN layer 526 is patterned by wet etching.

Figure 28A:
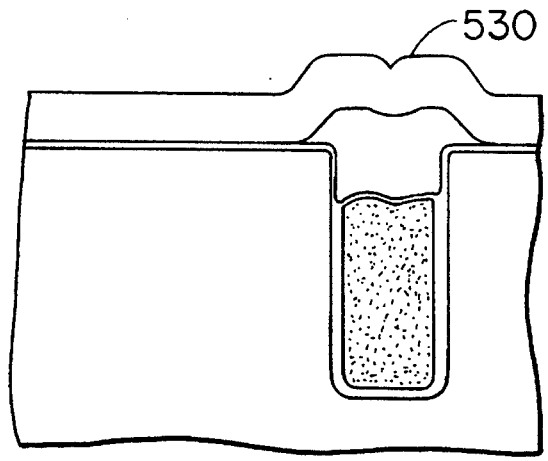
Figure 28B:
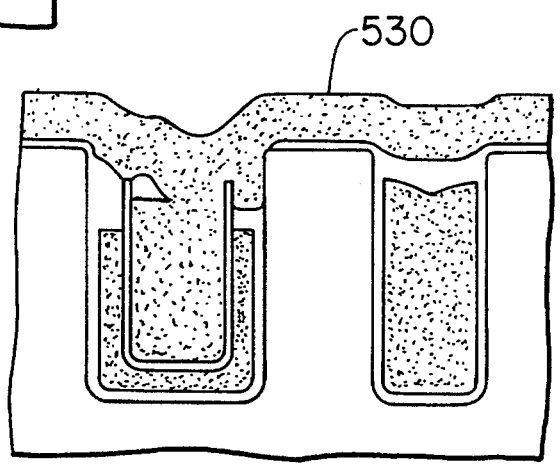

As shown in FIGS. 28A and 28B, after thin SiO$_2$ layer 522 is removed, poly Si layer 530, working as a second storage node electrode, is formed so as to be connected to first storage node electrode 516 in the wider trench 506 and the part of the sidewall of the island region 520. Poly Si layer 530 is etched back and is refilled in trenches 506.

Figure 29A:
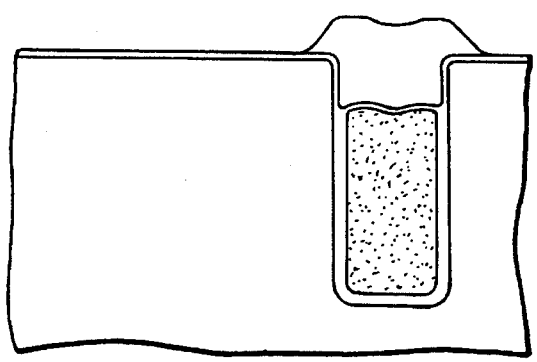
Figure 29B:
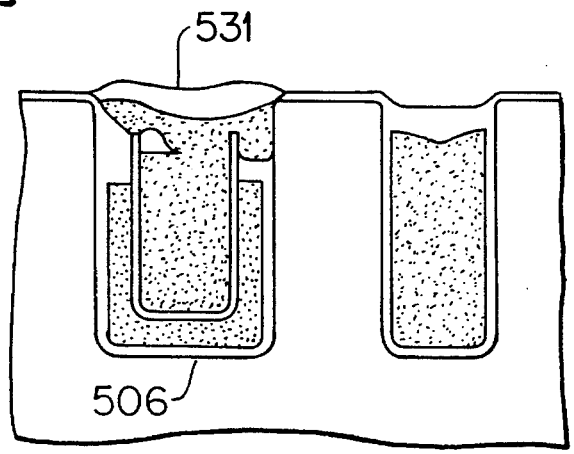

Then, the surface of the poly Si layer 530 is oxidized to form SiO$_2$ layer 531, as shown in FIGS. 29A and 29B.

Finally, as shown in FIGS. 23A and 23B, MOSFET 532 having a gate electrode 534, a gate insulating layer 536, and a source/drain regions 538 is formed on each island region 520. Bit line 540 is also formed according to a known manufacturing process. 542 is ann interlayer insulator.

According to the third embodiment, it is possible to attain more reliable DRAMs. One reason is that inversions of the substrate can be suppressed because each plate electrode receives at most ½ Vcc during device operations. Another reason is that capacitors are refilled flatly to prevent the interconnections of word lines or bit lines.

The narrower trench portions used as the field isolation regions and the wider trench portions used as the capacitors are formed simultaneously. That is, the formation of the field isolation portion can also be obtained easily or automatically.

It goes without saying that the leakage currents between memory cells can be reduced, as in the second embodiment.

Figure 30A:
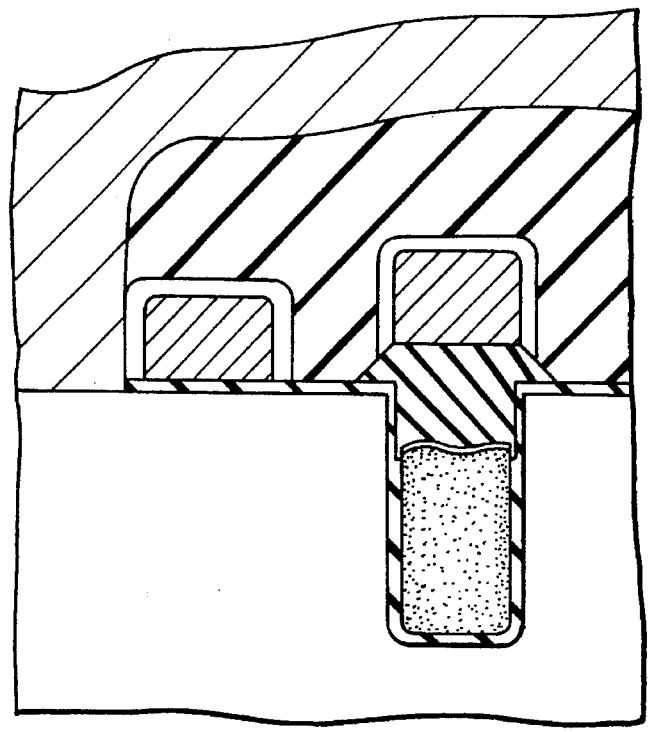
FIGS. 30A and 30B show schematic sectional views of a first modification of the third embodiment.
Figure 30B:
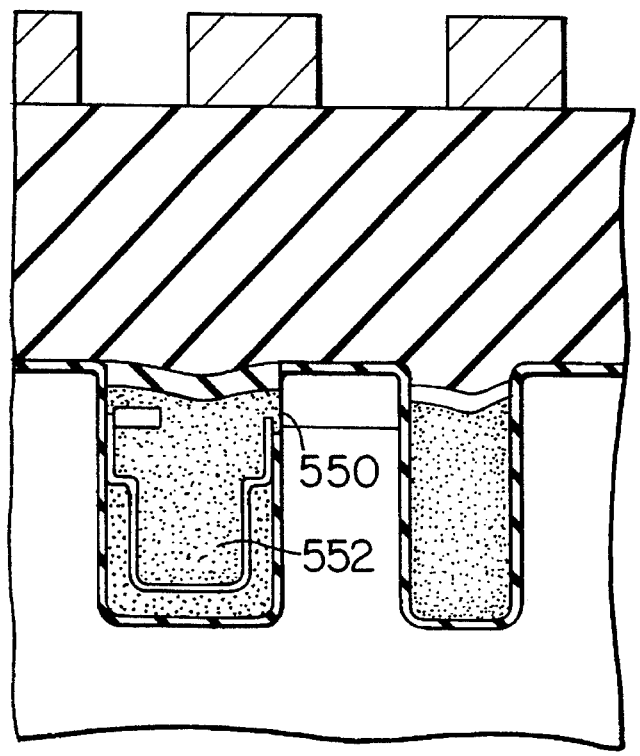

FIG. 30 shows a sectional view of a first modification of the third embodiment. The modification concerns a part of storage node contacts 550 and plate electrodes 552.

Figure 31A:
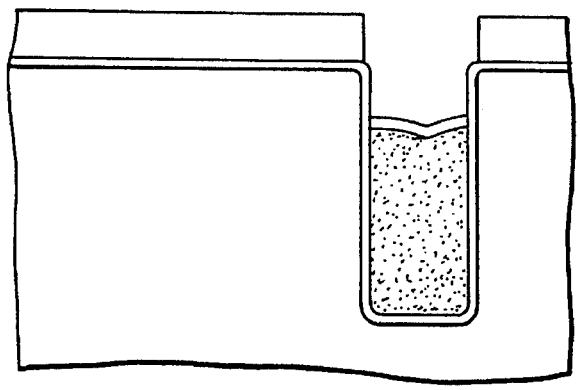
FIGS. 31A, 31B and 32A 32B are sectional views of a process of making the first modification.
Figure 31B:
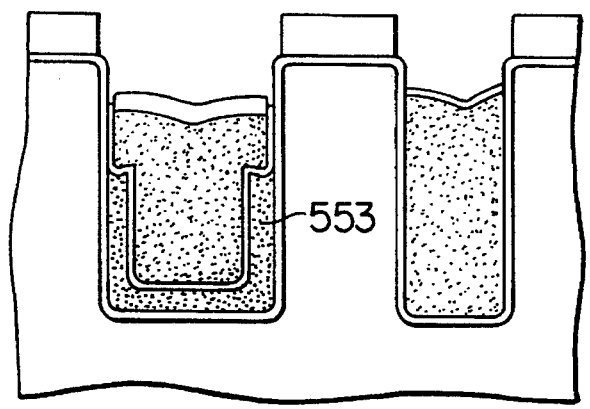
Figure 32A:
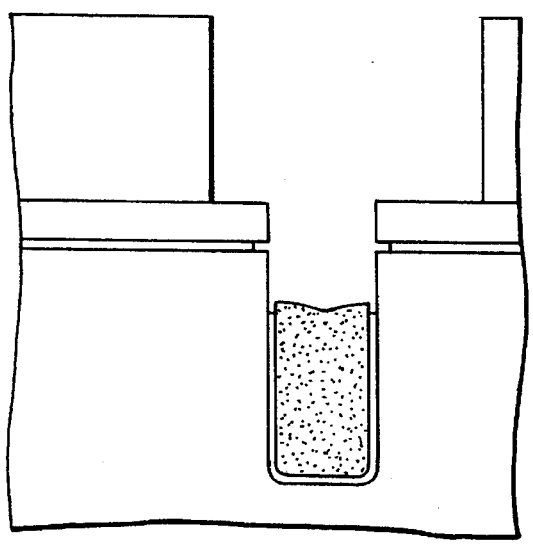
Figure 32B:
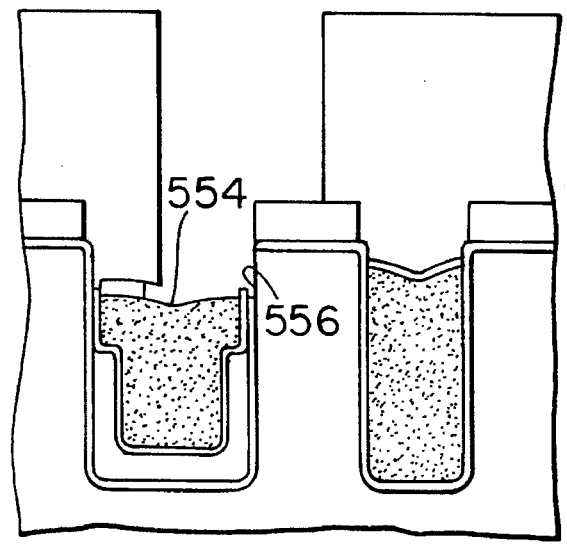

In the third embodiment, the upper portion of trenches 506 are locally oxidized, as shown in FIG. 24. However, in this modification, this step is skipped and the step of etching the upper portion of plate electrode 553 is added, as shown in FIG. 31. Then, a part of the surface of the storage node electrode 554 and the side wall of trench 556 are exposed (FIGS. 32A and 32B).

It is important that the time for exposing the surface of the storage node electrode 554 and the side wall of trench 556 is made shorter than that of the third embodiment, because there is no need to remove the thick local oxidized layer.

The other processes are almost the same as the third embodiment, so they are omitted here.

Figure 33:
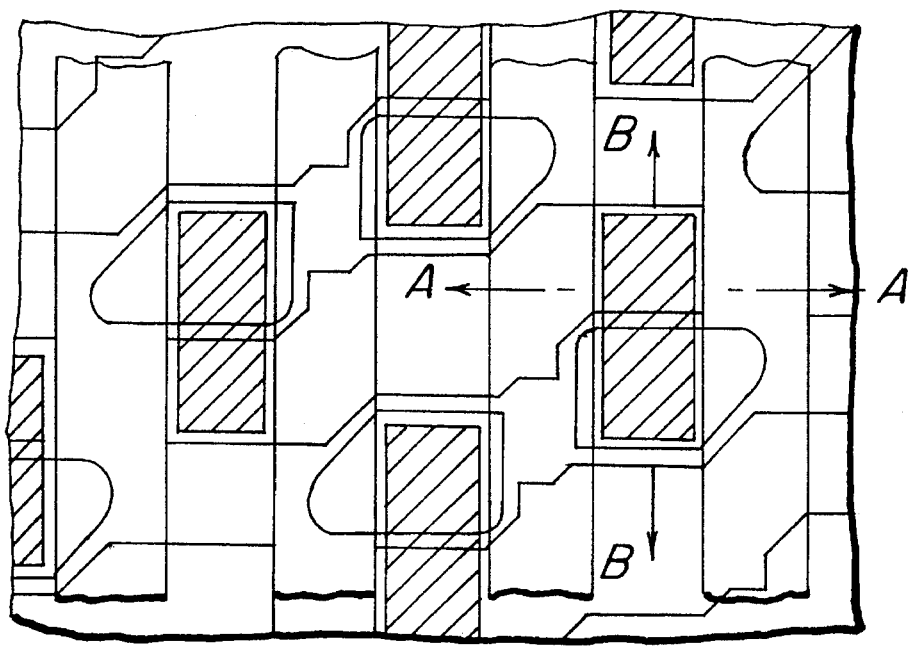
FIG. 33 shows a schematic plane view of a second modification of the third embodiment.

FIG. 33 shows a schematic plane view of a second modification of the third embodiment.

Figure 34A:
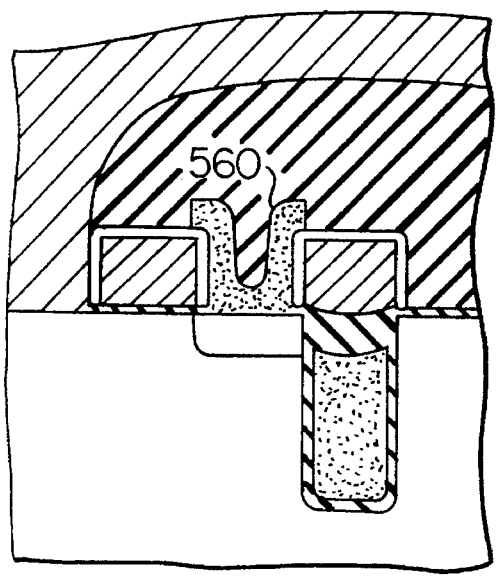
FIGS. 34A and 34B show sectional views of a second modification of the third embodiment, taken along respective lines A—A and B—B in FIG. 33.
Figure 34B:
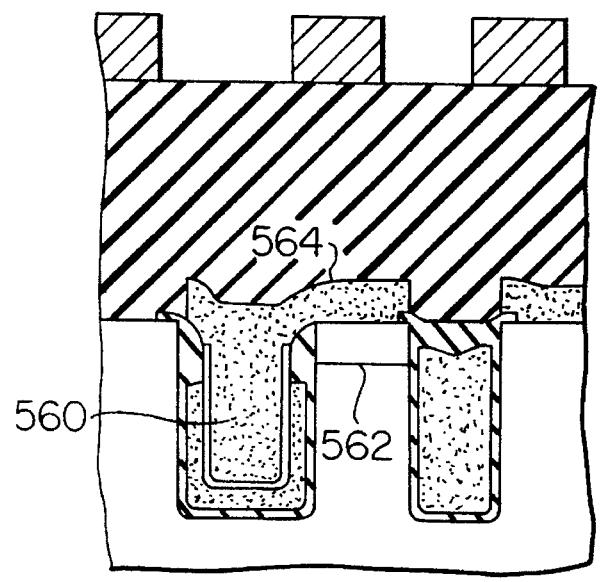

In this modification, each storage node electrode 560 connects with one of the diffusion layers 562 through a contact pad 564, which is a portion of a storage node electrode 560 (FIGS. 34A and 34B).

According to this embodiment, as each storage node contacts are formed on the surface of each island region, the manufacturing process will be simplified, as compared with the third embodiment.

Figure 35A:
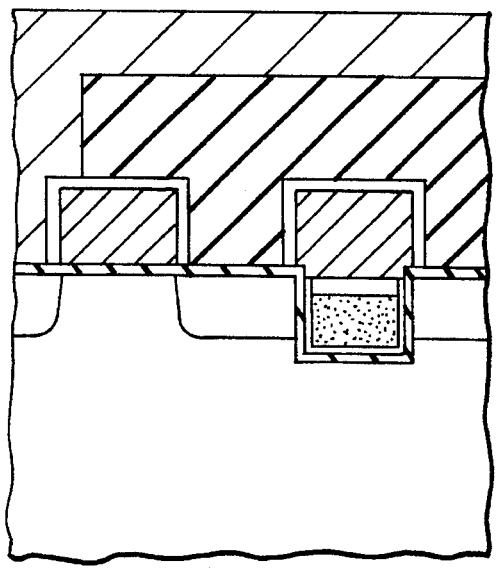
FIGS. 35A and 35B show sectional views of a third modification of the third embodiment, taken along respective lines A—A and B—B in FIG. 13.
Figure 35B:
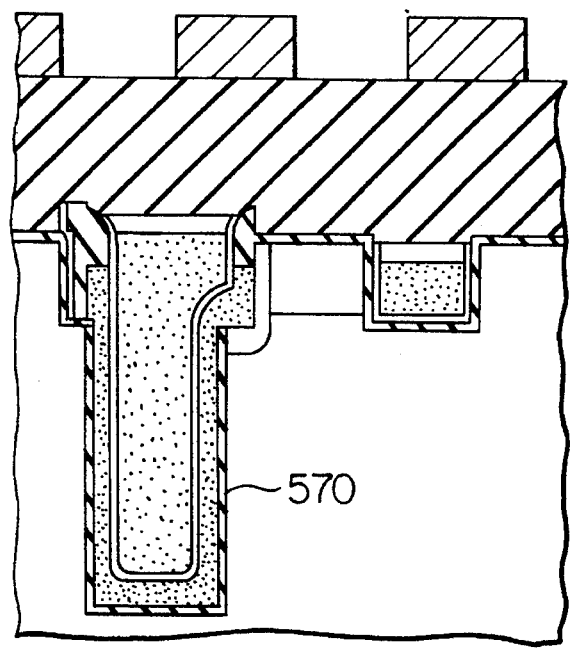

FIG. 35 shows a third modification of the third embodiment. In this modification, a capacitor is formed in a deep trench 570 having two steps, in order to increase the capacitance.

The processes to obtain the structure are almost the same as the third embodiment except for the adding of the deep trenches.

Some embodiments have been described above. However, it is also possible to use the invention for forming field isolations of peripheral circuits at the time when the DRAMs are formed according to the embodiments.

Figure 36:
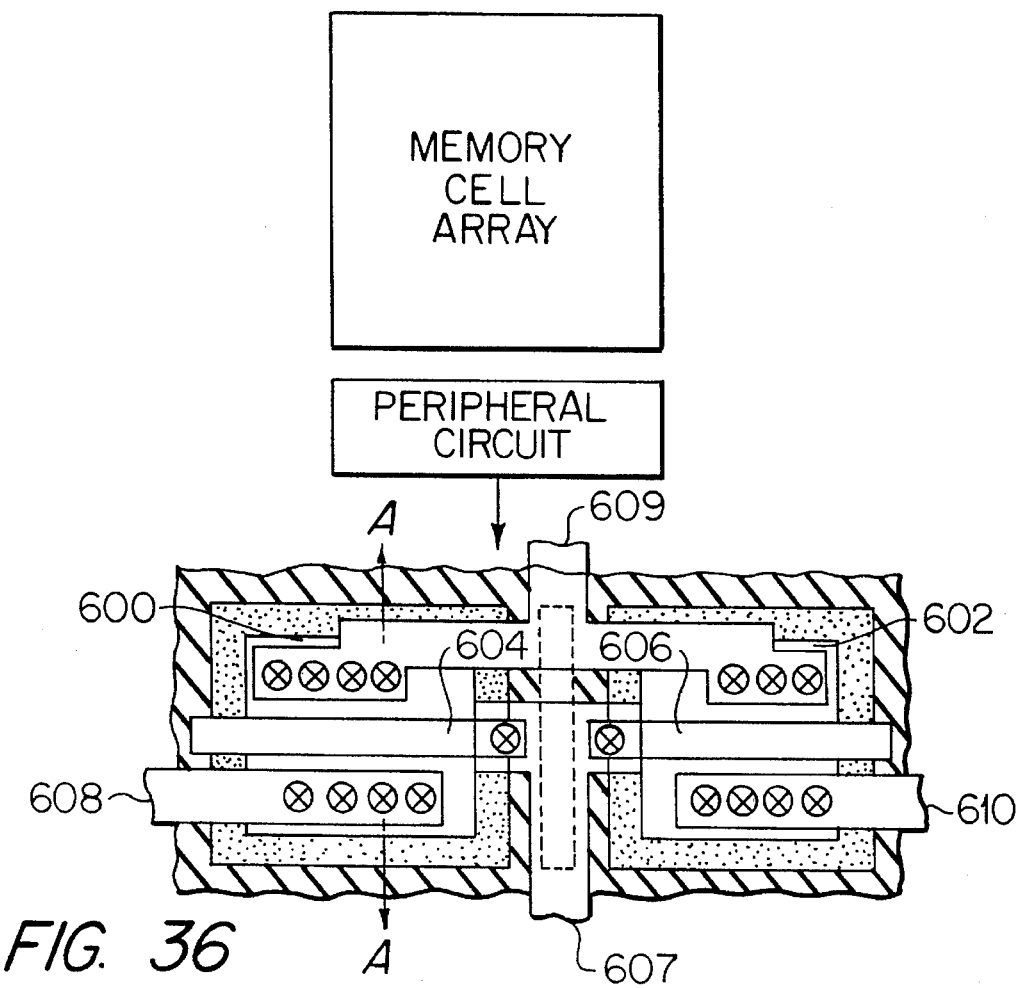
FIG. 36 shows a partial plane view of the peripheral circuit applied by the embodiments.
Figure 37:
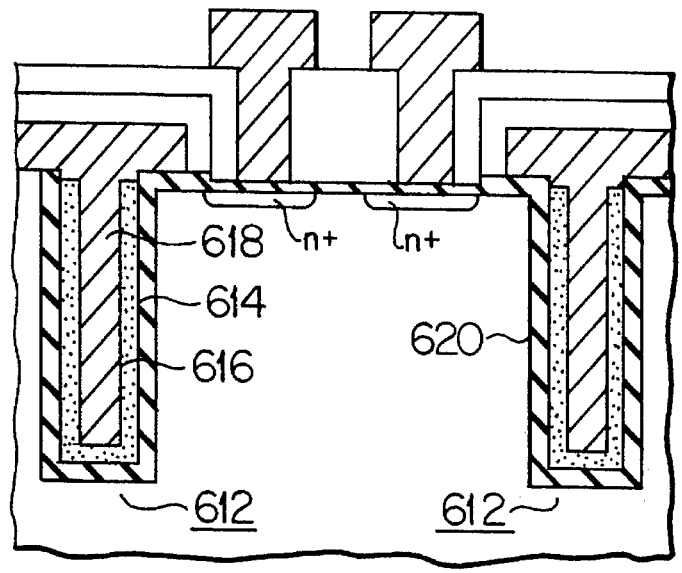
FIG. 37 is a sectional view of line A—A in FIG. 36.

FIG. 36 shows a partial plane view of the peripheral circuits. FIG. 37 is a sectional view of line A—A in FIG. 36.

There are n type island region 600, having p channel MOSFET 604, and a p type island region 602, having n channel MOSFET 606. Each island region is isolated from each other by trench region 612 for the field isolation.

Each MOSFETs 604 and 606 has a gate electrode, which is connected to an Al line (Vin) 607, and has a source/drain region, each one of the regions sharing a common Al line (Vout) 609. The other regions are connected to Vcc A line 608 and a Vss Al line 610, respectively.

As shown in FIG. 37, each island regions 600 and 602 is surrounded by the trench region 612. A first poly Si layer 614 and a second poly Si layer 618 are formed, when the plate electrode or the storage node electrode of the memory cells are formed according to the embodiments. 620 is a thermal $SiO_2$ and 616 is an $SiN/SiO_2$ layer.

A DRAM according to the fourth embodiment of the invention will now be described, with reference to FIG. 38.

Figure 38:
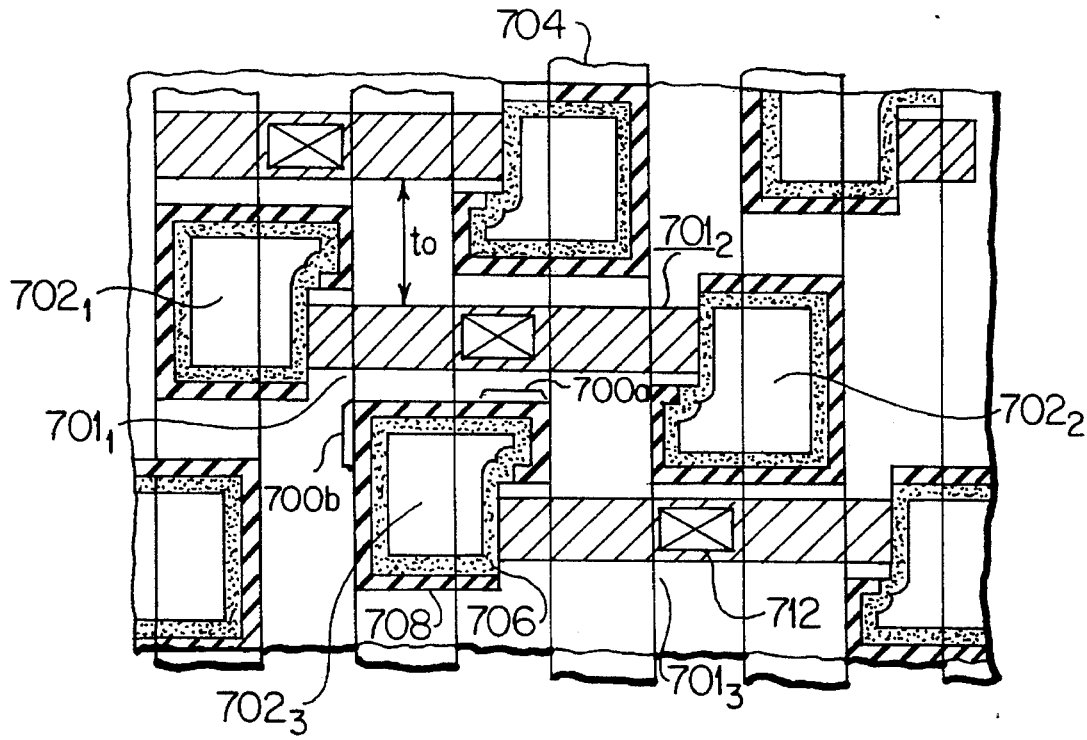
FIG. 38 shows a schematic plane view of the fourth embodiment.

FIG. 38 shows a plane view of the embodiment.

Figure 1A:
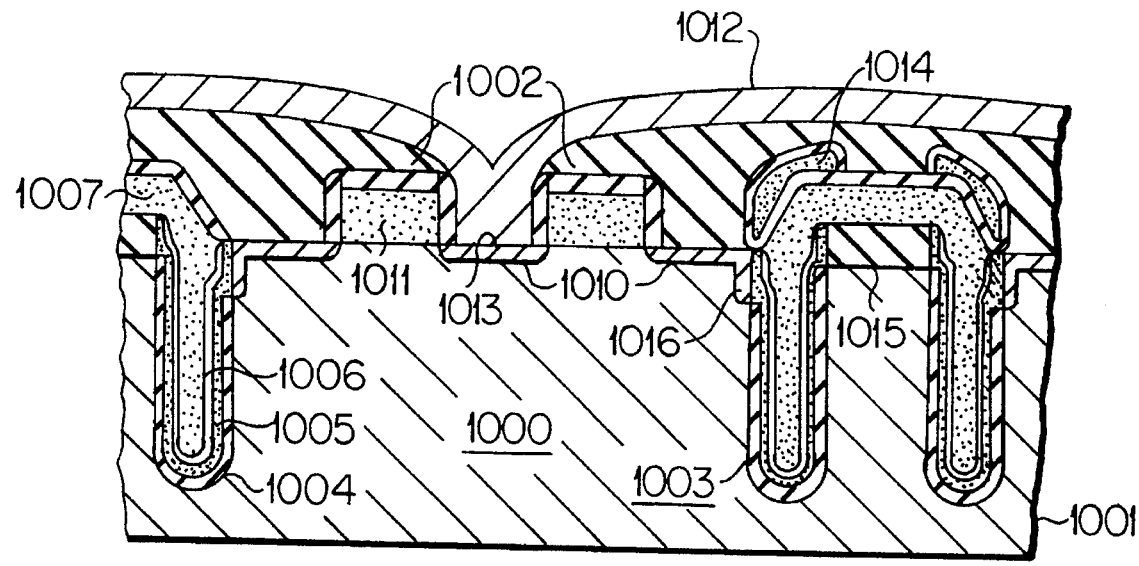
FIGS. 1A and 1B show schematic views of a conventional DRAM.
Figure 1B:
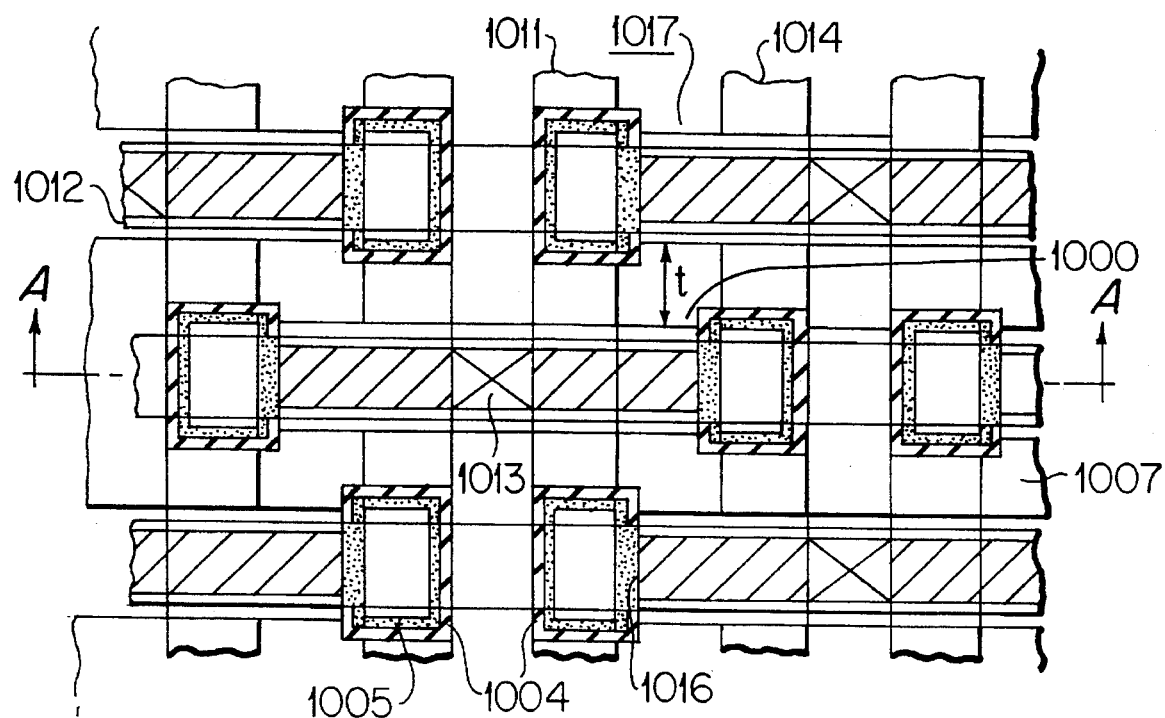

The A—A sectional view of the embodiment is similar to FIG. 1. That is, this embodiment has the usual field isolations, which is different from the above embodiments.

As shown in FIG. 38, the embodiment has a specific featuring trench capacitors $702_1$, $702_2$ and $702_3$ of each DRAM $701_1$, $701_2$ and $701_3$. That is, each capacitor has a first convex portion 700a, which juts out to the word line 704. Each capacitor also has a second convex portion 700b, which is close to one of the adjacent memory cells formed on the adjacent device regions, whereby the capacitance of the memory cells is increased.

Two adjacent cells $701_1$ and $701_2$, which share a bit line contact 712, are arranged in an array that is non-mirror symmetric each other.

A storage node electrode 706 of each capacitor is surrounded by an 8 mn thick insulating layer 708. A plate electrode (not shown in figures) is formed on the storage node through a capacitor insulating layer.

The insulating layer 708 which surrounds the first and second convex portion is formed to prevent leakage currents between the adjacent cells $701_2$ and $701_3$, especially between storage nodes of the cells. That is, capacitors $702_2$ and $702_3$ of two adjacent cells $701_2$ and $701_3$ are positioned closely, but the storage node contacts are separated from the others by the first convex portions 700a.

The array of the adjacent memory cells is like a nest of boxes, so as to be packed.

Another structure is similar to the structure shown in FIG. 1. A part of each storage node electrode 706 is connected to one of the source/drain regions of the MOSFET. Bit line contact 712 is connected to one of the other regions. 500 mn thick field isolations are formed by a known LOCOS method.

The manufacturing method of this embodiment is the same as the usual method except the method of forming trench capacitors 702 which have the first and second convex portion and non-mirror symmetry as in FIG. 38.

According to this embodiment, leakage currents between two adjacent cells can be decreased because the distance between the storage nodes are longer by the first convex portion 700a. The capacitance can be increased because the size of the trench capacitors are enlarged by the second convex portion 700b. The manufacturing processes can be simplified because the capacitor size is enlarged.

Figure 39:
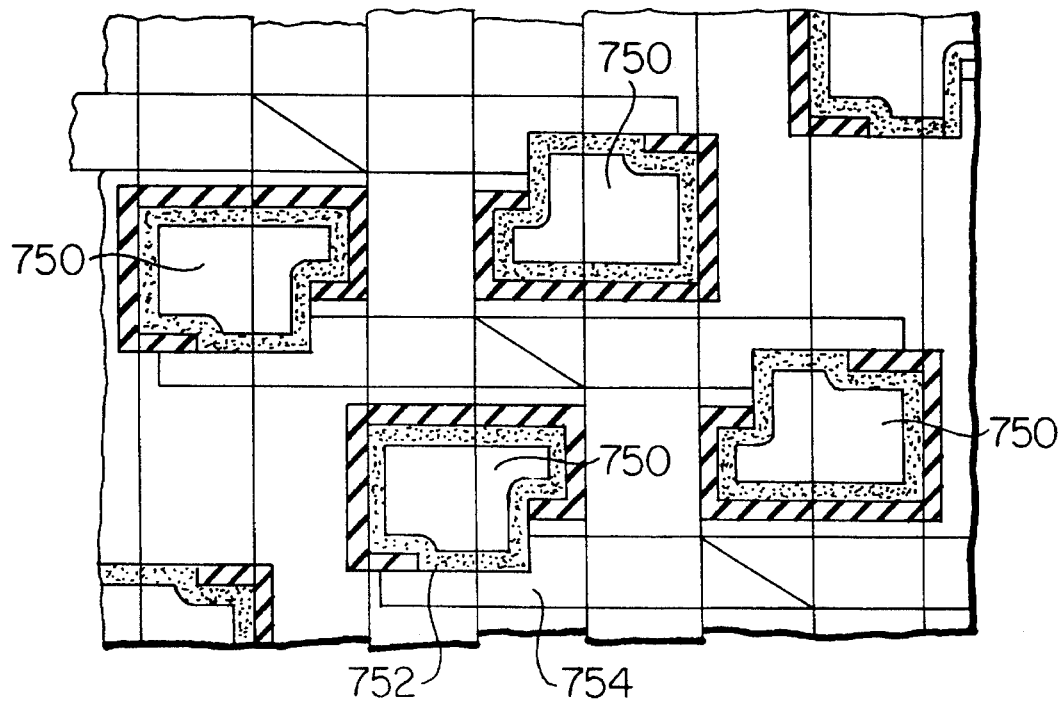
FIG. 39 shows a schematic plane view of a first modification of the fourth embodiment.

FIG. 39 is a plane view of a modification of the fourth embodiment.

In this modification, trench capacitors 750 are formed to be positioned between two adjacent bit lines (not shown in the figure). A part of each storage node 752 is in contact with a device region 754.

Figure 40:
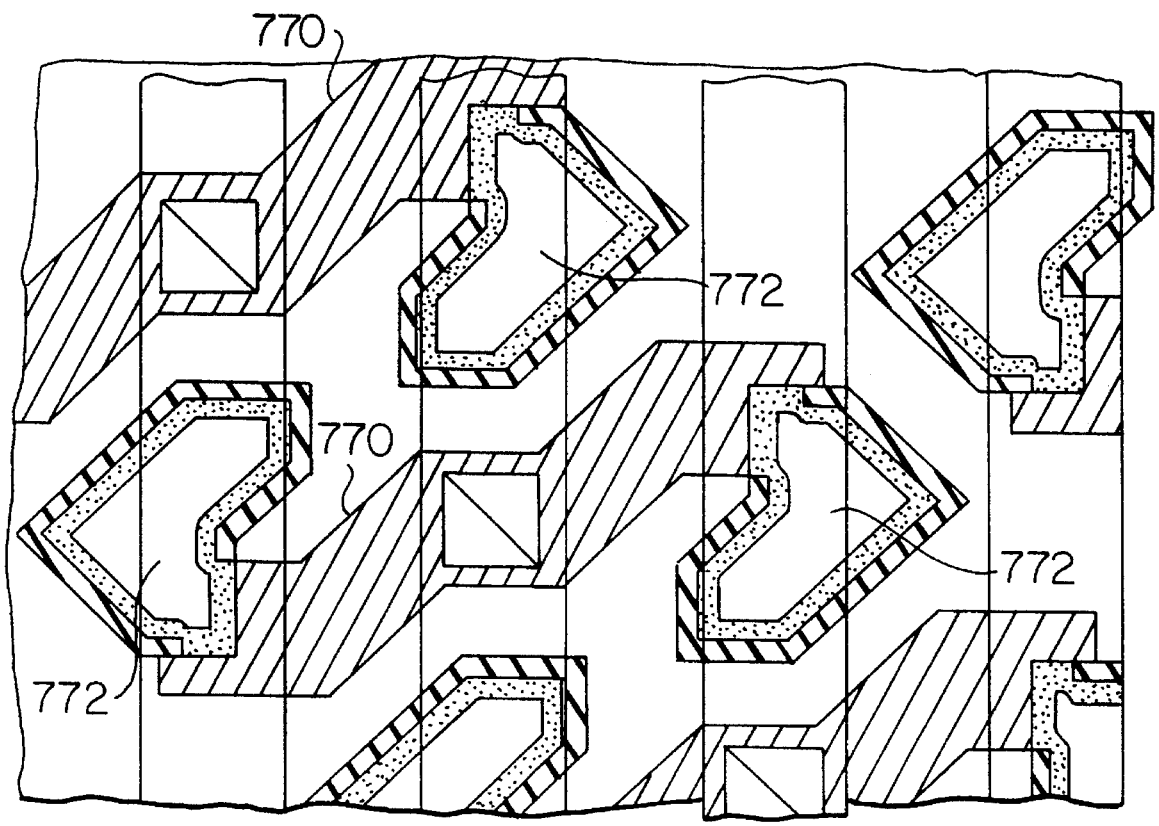
FIG. 40 shows a schematic plane view of a second modification of the fourth embodiment.

FIG. 40 is a plane view of a second modification of the fourth embodiment.

In this modification, device regions 770, which are shown by oblique lines, and capacitors 772 are changed in form.

With the above two modifications, almost the same result as with the fourth embodiment can be obtained.

Numerous modifications and variations of the present invention are possible in light of the above teachings. It is therefore to be understood that, within the scope of the appended claims, the present invention can be practiced in a manner other than as specifically described herein.

What is claimed is:

1. A dynamic RAM array comprising:

a substrate;

a plurality of semiconductor island regions on the substrate;

a trench region in the substrate, the trench region surrounding each of the island regions, and the trench region having a plurality of first trench portions and a plurality of a second trench portions, the first trench portions being wider than said second trench portions;

an insulation layer on the trench region;

capacitors in the first trench portions, the capacitors not extending beyond the first trench portions, and each of the capacitors having a plate electrode, a capacitor insulating layer and a storage node electrode;

field isolation regions entirely in the second trench portions;

MOS transistors on the island regions, each of the MOS transistors having a source, a drain and a gate, the gate being a word line, one of the source and drain being coupled with the storage node electrode; and bit lines perpendicular to the word line, the bit lines being coupled with other of the source and drain of the MOS transistors.

2. The dynamic RAM array according to claim 1, wherein the plurality of semiconductor island regions on the substrate are arranged in a checker pattern.

3. The dynamic RAM array according to claim 1, wherein the plate electrode is formed on the insulating layer in the first trench portions, and each of the island regions is surrounded by the insulating layer and the plate electrode.

4. The dynamic RAM array according to claim 2, wherein each of the island regions includes a plurality of corner portions, and the first trench portions respectively located between the corner portions of adjacent island regions is completely filled with an insulating material.

5. The dynamic RAM array according to claim 1, wherein the field isolation region and the plate electrode are made of same material.

6. The dynamic RAM array according to claim 1, wherein the bit lines are arranged in an array of an open bit line architecture.

7. The dynamic RAM array according to claim 1, wherein the plate electrode includes a surface having a roughness.

8. The dynamic RAM array according to claim 1, wherein each of the island regions has two MOS transistors and further includes two capacitors adjacent said each of the island regions.

9. The dynamic RAM array according to claim 1, wherein the storage node electrode is formed on the insulating layer in the first trench portions.

10. The dynamic RAM array according to claim 9, wherein the insulating layer formed in the first trench portions includes a first insulating layer and a second insulating layer on the first insulating layer.

11. The dynamic RAM array according to claim 1, wherein the capacitor is planarized.

12. The dynamic RAM array according to claim 8, wherein the first trench portions each has a deep trench portion, the first trench portion increasing capacitance of the dynamic RAM array.

13. The dynamic RAM array according to claim 8, further comprising:
- a plurality of second island regions and a second trench region in the substrate, the second island regions being separated from the first island regions by said trench region, and each of the second island regions being surrounded by the second trench region;
- a peripheral circuit on the second island regions; and
- a plurality of second field isolation regions in the second trench region, the second field isolation regions being made of the insulating material.

14. A dynamic RAM array comprising:
- a semiconductor substrate;
- a plurality of semiconductor island regions on the substrate, each of the island regions having corners and arranged in a checkered layout;
- a trench region in the substrate, the trench region surrounding each of the island regions, the corners of adjacent island regions being positioned according to a predetermined distance with respect to each other, an the trench region having a plurality of first trench portions and a plurality of second trench portions, the first trench portions being wider than the second trench portions, and the second trench portion being determined by the distance;
- an insulation layer on the trench region;
- capacitors in the first trench portions, the capacitors not extending beyond the first trench portions, and each of the capacitors having a plate electrode, a capacitor insulating layer and a storage node electrode;
- field isolation regions in the second trench portions, the field isolation regions including insulation material;
- MOS transistors on the island regions, each of the MOS transistors having a source, a drain and a gain, the gate being a word line, one of the source and drain being coupled with the storage node electrode; and
- bit lines perpendicular to the word line, the bit lines being coupled with the other of the source and drain of the MOS transistor.

15. A dynamic RAM having a memory cell comprising:
- a semiconductor substrate;
- a MOS transistor on the substrate having a source, a drain and a gate, the gate acting as a word line;
- a trench region, having a protruded portion for blocking leakage currents, the protruded portion being near the MOS transistor on the substrate;
- an insulating layer covering an inner wall of the trench region having the protruded portion and having an opening;
- a capacitor in the trench region, the capacitor not extending beyond the trench region, and the capacitor including a plate electrode, a capacitor insulating layer and a storage node electrode, the storage node electrode being connected with one of the source and drain of the MOS transistor at the opening of the insulating layer; and
- a bit line perpendicular to the word line and coupled with the other of the source and drain of the MOS transistor.

16. The dynamic RAM having a memory cell according to claim 15, further including an adjacent memory cell sharing a bit line contact with said memory cell, and wherein the memory cell and the adjacent memory cell are arranged non-mirror symmetrical to each other.

17. The dynamic RAM having a memory cell according to claim 15, wherein the trench region further includes a second protruded portion for increasing a capacitance of the capacitor.

* * * * *